(12) United States Patent
Kurokawa et al.

(10) Patent No.: US 12,726,000 B2
(45) Date of Patent: Sep. 1, 2026

(54) BONDING DEVICE AND BONDING METHOD

(71) Applicant: Sumitomo Electric Industries, Ltd., Osaka (JP)

(72) Inventors: Munetaka Kurokawa, Osaka (JP); Naoki Fujiwara, Osaka (JP); Takehiko Kikuchi, Osaka (JP); Kazuo Kasaya, Kasaoka-City (JP); Takeshi Maruyama, Kasaoka-City (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 664 days.

(21) Appl. No.: 18/209,008

(22) Filed: Jun. 13, 2023

(65) Prior Publication Data

US 2023/0420910 A1 Dec. 28, 2023

(30) Foreign Application Priority Data

Jun. 22, 2022 (JP) ................................ 2022-100571

(51) Int. Cl.
*H01S 5/0236* (2021.01)
*C04B 37/00* (2006.01)
*H01S 5/02* (2006.01)

(52) U.S. Cl.
CPC .......... *H01S 5/0236* (2021.01); *C04B 37/001* (2013.01); *C04B 2237/36* (2013.01); *H01S 5/0201* (2013.01)

(58) Field of Classification Search
CPC ... H01S 5/0236; H01S 5/0201; C04B 37/001; C04B 2237/36
See application file for complete search history.

(56) References Cited

U.S. PATENT DOCUMENTS 4,913,335 A * 4/1990 Yoshida .............. H10P 72/0444 228/103
6,203,637 B1 * 3/2001 Dommann ............ B08B 7/0035 156/73.1
2005/0142815 A1 * 6/2005 Miyazaki ............... H10P 72/74 438/464

(Continued)

FOREIGN PATENT DOCUMENTS

| | | |
|---|---|---|
| JP | 2009239288 A | 10/2009 |
| JP | 2006007321 A | 3/2022 |
| WO | 2019198801 A1 | 10/2019 |

OTHER PUBLICATIONS

V. Masteika, et al., "A Review of Hydrophilic Silicon Wafer Bonding," ECS Journal of Solid State Science and Technology, vol. 3, No. 4, pp. Q42 to Q54, 2014.

(Continued)

*Primary Examiner* — Alex B Efta
(74) *Attorney, Agent, or Firm* — Volpe Koenig

(57) ABSTRACT

A bonding device includes an irradiator that irradiates a surface of a first component with ultraviolet rays, and a conveyor that conveys the first component, wherein the irradiator irradiates the first component held by the conveyor with the ultraviolet ray, and the conveyor conveys the first component irradiated with the ultraviolet rays to a surface of a second component, and brings the surface of the first component and the surface of the second component into contact with each other to bond the first component and the second component.

14 Claims, 19 Drawing Sheets

(56) References Cited

U.S. PATENT DOCUMENTS

2006/0037997 A1 2/2006 Higashi et al.
2006/0273440 A1* 12/2006 Okamoto ............ H10P 72/0428 257/E21.705
2007/0242244 A1* 10/2007 Nagasaka ........... G03F 7/70716 355/72
2010/0209855 A1* 8/2010 Tanaka ...................... G03F 7/38 430/319
2014/0224405 A1* 8/2014 Kinouchi ............ H10P 72/0428 156/64
2020/0381387 A1* 12/2020 Mitsuishi .............. H10W 46/00
2020/0411472 A1 12/2020 Chung et al.

OTHER PUBLICATIONS

A. Iawai, et al., “Void-free direct bonding of InP to Si: Advantages of low H-content and ozone activation,” Journal of Vacuum Science & Techonolgy B., vol. 32, No. 2, pp. 021201-1 to 021201-5, 2014.

* cited by examiner

BONDING DEVICE AND BONDING METHOD

CROSS REFERENCE TO RELATED APPLICATIONS

This application claims priority based on Japanese Patent Application No. 2022-100571, filed on Jun. 22, 2022, and the entire contents of the Japanese patent applications are incorporated herein by reference.

FIELD

The present disclosure relates to a bonding device and a bonding method.

BACKGROUND

There is a technology to bond semiconductors. For example, there is a technique for bonding a silicon (Si) wafer using bond between hydroxyl groups (—OH) by hydrophilizing the surface of the silicon (Si) wafer using oxygen plasma (Non-Patent Document 1: V. Masteika et al., "A Review of Hydrophilic Silicon Wafer Bonding", ECS Journal of Solid State Science and Technology, Vol. 3, No. 4, pp. Q42 to Q54, 2014). There is also a technique for bonding an indium phosphide (InP) chip to a Si wafer by generating ozone ($O_3$) from oxygen ($O_2$) by ultraviolet rays and hydrophilizing the surface of the Si wafer by the ozone (Non-patent Document 2: A. Iawai et al., "Void-free direct bonding of InP to Si: Advantages of low H-content and ozone activation", Journal of Vacuum Science & Technology B, Vol. 32, No. 2, pp. 021201-1 to 021201-5, 2014).

SUMMARY

A bonding device according to the present disclosure includes an irradiator that irradiates a surface of a first component with ultraviolet rays, and a conveyor that conveys the first component, wherein the irradiator irradiates the first component held by the conveyor with the ultraviolet ray, and the conveyor conveys the first component irradiated with the ultraviolet rays to a surface of a second component, and brings the surface of the first component and the surface of the second component into contact with each other to bond the first component and the second component.

A bonding method according to the present disclosure is a bonding method for bonding the first component and the second component using the above-mentioned bonding device.

DETAILED DESCRIPTION OF EMBODIMENTS

Figure 1:
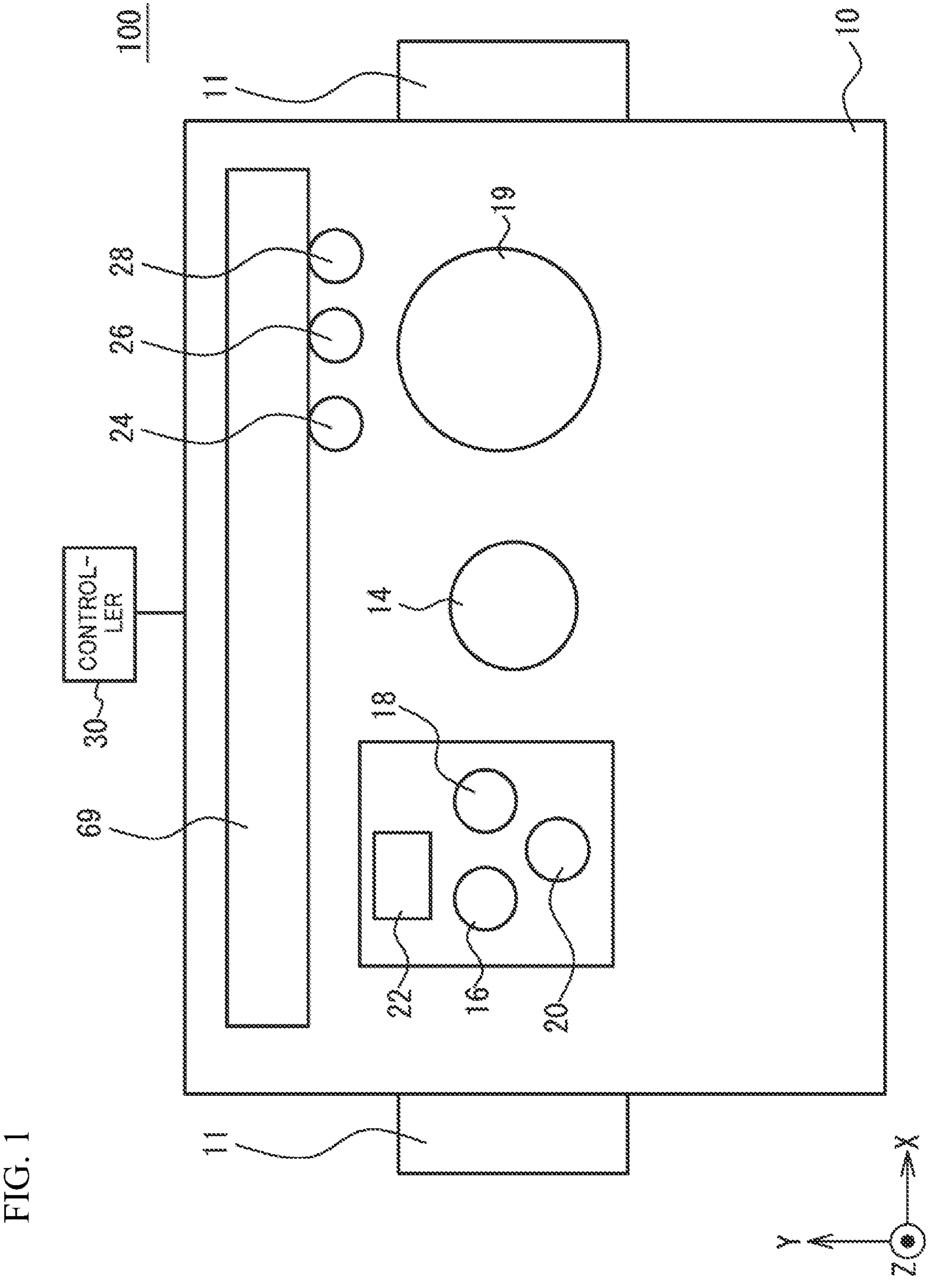
FIG. 1 is a schematic diagram illustrating a bonding device according to a first embodiment.

In the bonding by plasma activation, a plasma device for irradiating plasma in vacuum and a bonding device are used. In the bonding using hydrophilization by ozone, an ultraviolet irradiation device for generating ozone and a bonding device are used. When the wafer is transferred to the bonding device after hydrophilization, there is a possibility that dust adheres to the hydrophilized surface. In the time from the hydrophilization of the surface to the bonding, the hydrophilization performance of the surface deteriorates. As a result, the bonding strength may be decreased.

The present disclosure has been made in view of the above problems, and an object of the present disclosure is to provide a bonding device and a bonding method capable of suppressing a decrease in bonding strength.

Details of Embodiments of the Present Disclosure

First, the contents of the embodiments of this disclosure are listed and explained.

(1) A bonding device according to the present disclosure includes an irradiator that irradiates a surface of a first component with ultraviolet rays, and a conveyor that conveys the first component, wherein the irradiator irradiates the first component held by the conveyor with the ultraviolet ray, and the conveyor conveys the first component irradiated with the ultraviolet rays to a surface of a second component, and brings the surface of the first component and the surface of the second component into contact with each other to bond the first component and the second component. Since the time from hydrophilization to bonding is shortened, adhesion of dust and deterioration of hydrophilization performance are suppressed. Decrease in bonding strength is suppressed.

(2) In the above (1), the irradiator may irradiate a surface of one of a plurality of first components with the ultraviolet rays, the conveyor may bond the one of the first components and the second component, after bonding the one of the first components and the second component, the irradiator may irradiate a surface of another first component of the plurality of first components with the ultraviolet rays, and the conveyor may bond the another first component and the second component. Each of the plurality of first components is bonded immediately after the hydrophilization. Variations in bonding strength can be suppressed.

(3) In the above (1) or (2), the bonding device may further include a first placing member that places the first component, a second placing member that places the second component, and a housing that houses the irradiator, the conveyor, the first placing member, and the second placing member therein. The bonding device can perform the process from the irradiation of the ultraviolet rays to the bonding. Adhesion of dust is suppressed, and deterioration of hydrophilization performance with passage of time is suppressed.

(4) In any one of (1) to (3) above, the irradiator may irradiate the surface of the first component and a surface of the second component with the ultraviolet rays. Since both the first component and the second component are hydrophilized, the bonding strength is increased.

(5) In any one of (1) to (4) above, the irradiator may include a first irradiator and a second irradiator, the first irradiator may irradiate the surface of the first component with the ultraviolet rays, and the second irradiator may irradiate the surface of the second component with the ultraviolet rays. Since both the first component and the second component are hydrophilized, the bonding strength is increased.

(6) In any one of (1) to (5) above, the bonding device may further include a brancher that branches the ultraviolet rays emitted from the irradiator. The surface of the first component and the surface of the second component may be irradiated with the ultraviolet rays branched by the brancher. Since both the first component and the second component are hydrophilized, the bonding strength is increased.

(7) In any one of (1) to (6) above, the bonding device may further include a cover having a cavity therein. A gas containing oxygen may be introduced into the cavity in the cover, and the irradiator may irradiate the surface of the first component arranged in the cavity in the cover with the ultraviolet rays. Ozone is generated by irradiating the ultraviolet rays into the gas containing oxygen. The surface is hydrophilized by ozone.

(8) In the above (7), a gas containing oxygen and nitrogen may be introduced into the cavity in the cover, and the bonding device may include an adjuster that adjusts concentrations of the oxygen and the nitrogen. By increasing the ozone concentration, hydrophilization can be performed quickly and the irradiation time of ultraviolet rays can be shortened.

(9) In any one of (1) to (6) above, the bonding device may further include a cover having a cavity therein. A gas containing oxygen may be introduced into the cavity in the cover, a first wall of the cover facing the irradiator may transmit the ultraviolet rays, the cover may have a first opening in a second wall facing the first wall, and the conveyor may convey the first component to the first opening. The mixing of outside air into the cavity is suppressed, and generation of ozone in the cavity is stabilized.

(10) In the above (9), the cover may have a first inner wall, a second inner wall, an intake port, and an exhaust port. The first inner wall and the second inner wall may be provided in the cavity. The first inner wall may divide the cavity into a first cavity and a second cavity, and have a second opening at a position facing the first opening. The first cavity may be located between the first wall and the first inner wall. The second cavity may be located opposite to the first cavity with the first inner wall interposed therebetween. The second inner wall may be provided between the first wall and the first inner wall, extend along an outer wall of the cover, and divide the first cavity into a third cavity and a fourth cavity. The third cavity may be located between the outer wall and the second inner wall. The fourth cavity may be located inside the second inner wall and communicate with the third cavity. The intake port may be connected to a portion of the outer wall facing the third cavity. The exhaust port may be connected to a portion of the outer wall facing the second cavity. It is possible to generate ozone with stable efficiency.

(11) In the above (9) or (10), a length of the first opening may be greater than a length of the first component and less than three times the length of the first component. Ozone can be brought into uniform contact with the surface of the first component. Excessive outward diffusion of ozone can be suppressed.

(12) In any one of (1) to (11) above, the first component may be a semiconductor chip formed of a compound semiconductor, and the second component may be a substrate containing silicon. Components made of different materials can be bonded together.

(13) A bonding method for bonding the first component and the second component using the bonding device of any one of (1) to (12).

Specific examples of the bonding device and a bonding method in accordance with embodiments of the present disclosure are described below with reference to the drawings. The present disclosure is not limited to these examples, but is indicated by the claims, which are intended to include all modifications within the meaning and scope of the claims.

First Embodiment

FIG. 1 is a schematic diagram illustrating a bonding device 100 according to a first embodiment, and schematically illustrates a state of the bonding device 100 as viewed from a Z-axis direction. As illustrated in FIG. 1, the bonding device 100 includes a housing 10, a clean booth unit 11, a grip ring supplier 19 (first placing member), a bonding stage 14 (second placing member), a chip stage 20, an ultraviolet irradiator 16, cameras 18 and 24, a gel pack supplier 22 (first placing member), a movable part 69, collets 26 and 28 (conveyor), and a controller 30.

Two sides of the housing 10 are parallel to an X-axis direction, and the other two sides are parallel to a Y-axis direction. The bottom surface of the housing 10 is parallel to an XY-plane. The length of the housing 10 may be several meters such as one meter or two meters, or may be less than one meter such as several tens of centimeters. The Z-axis direction is a direction normal to the bottom surface of the housing 10. The X-axis direction, the Y-axis direction and the Z-axis direction are orthogonal to each other.

The housing 10 separates a space inside the housing 10 from the outside of the housing 10. The grip ring supplier 19, the bonding stage 14, the chip stage 20, the cameras 18 and 24, the gel pack supplier 22, and the collets 26 and 28 are housed in the space inside the housing 10.

The clean booth unit 11 includes, for example, a filter and reduces dust in the air inside the housing 10 compared to the air outside the housing 10.

The grip ring supplier 19 is, for example, a ring-shaped member. A semiconductor chip 40 (first component) described later is mounted on the grip ring supplier 19. A gel-like substance is disposed in the gel pack supplier 22. The semiconductor chip 40 may be disposed on the gel of the gel pack supplier 22.

The bonding stage 14 and the chip stage 20 are concave or plate-like members. A wafer 42 (second component) described later is mounted on the bonding stage 14. The bonding stage 14 is a heater stage including, for example, a heater and capable of changing the temperature.

The ultraviolet irradiator 16 includes a light source such as an excimer light source or a deuterium light source, and emits ultraviolet rays (ultraviolet rays) in the Z-axis direction. Ultraviolet rays include, for example, light having a wavelength of 400 nm or less.

The collets 26 and 28 are movable in the X-axis direction, the Y-axis direction, and the Z-axis direction by a movable part 69. The collets 26 and 28 are capable of attracting an object such as the semiconductor chip 40 to the tip thereof by attracting the object.

The controller 30 includes, for example, a computer and controls the bonding device 100. The controller 30 acquires images captured by the cameras 18 and 24. The controller 30 switches on/off the suction of the collets 26 and 28 and moves the collets 26 and 28. The controller 30 controls the ultraviolet irradiator 16 to turn the ultraviolet rays on and off.

Figure 2A:
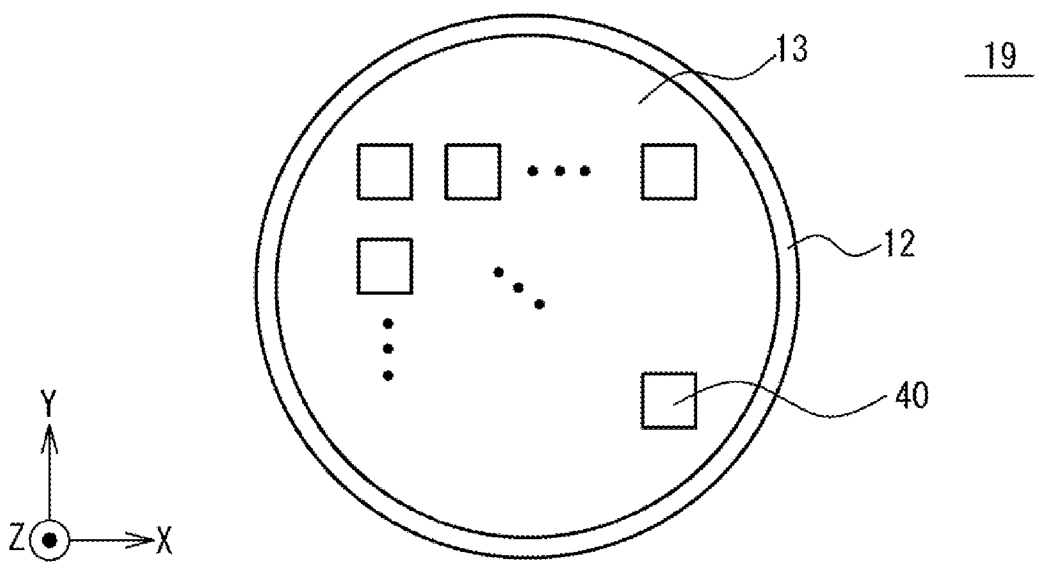
FIG. 2A is a plan view illustrating a grip ring supplier.

FIG. 2A is a plan view illustrating the grip ring supplier 19. A grip ring 12 of the grip ring supplier 19 is an outer frame for pressing an expanded adhesive tape 13. A plurality of semiconductor chips 40 are placed on the adhesive tape 13.

The semiconductor chip 40 is made of a compound semiconductor such as indium phosphide (InP). The semiconductor chip 40 has an optical gain and generates light in response to the injection of current. The shape of the semiconductor chip 40 is, for example, a rectangle having a length of 2 mm per side. The plurality of semiconductor chips 40 are formed by dicing a III-V compound semiconductor wafer. The number of semiconductor chips 40 placed on the grip ring supplier 19 is, for example, several hundreds or thousands.

Figure 2B:
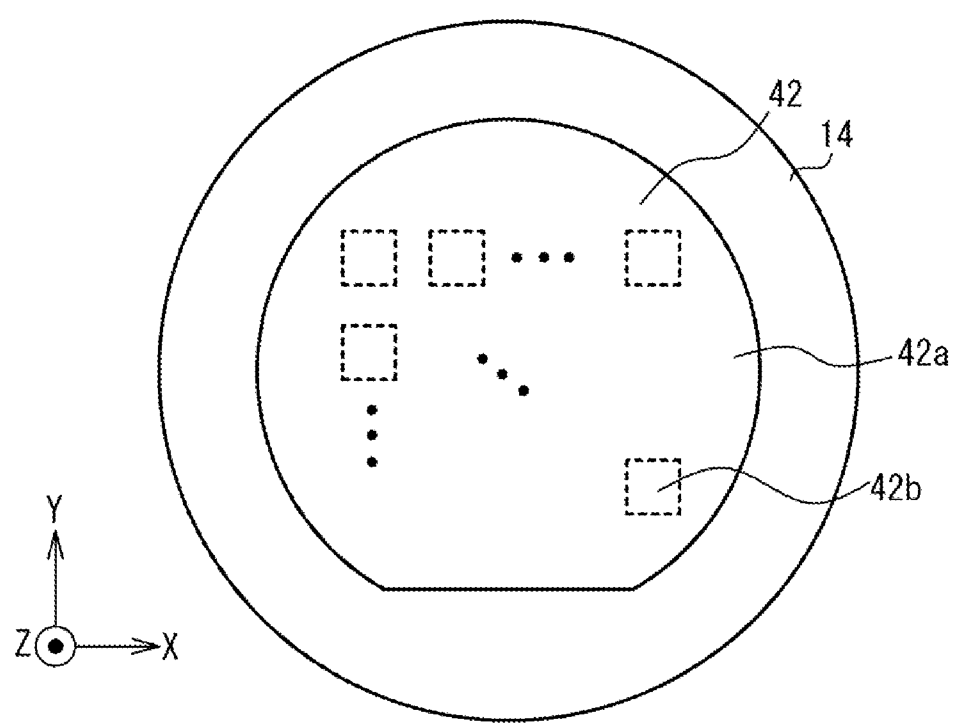
FIG. 2B is a plan view illustrating a bonding stage.

FIG. 2B is a plan view illustrating the bonding stage 14. The wafer 42 is placed on the upper surface of the bonding stage 14. The diameter of the wafer 42 is, for example, 50 mm or more and 300 mm or less and is larger than that of the semiconductor chip 40. The wafer 42 is, for example, a silicon wafer or an SOI (Silicon on Insulator) substrate. A surface 42_a_ of the wafer 42 is formed of silicon (Si), for example. An optical element such as an optical waveguide (not illustrated) is formed on the surface 42_a_. The dotted line in FIG. 2B represents a region 42_b_. The region 42_b_ is a region of the surface 42_a_ to which the semiconductor chip 40 is bonded.

Figure 3:
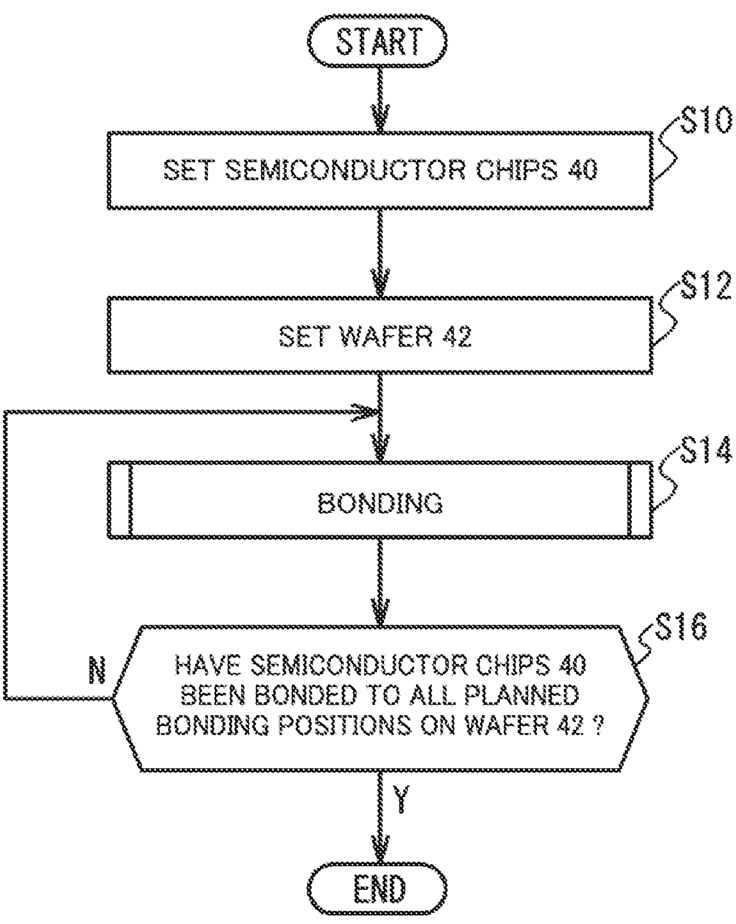
FIG. 3 is a flowchart illustrating a step of bonding using the bonding device.
Figure 4:
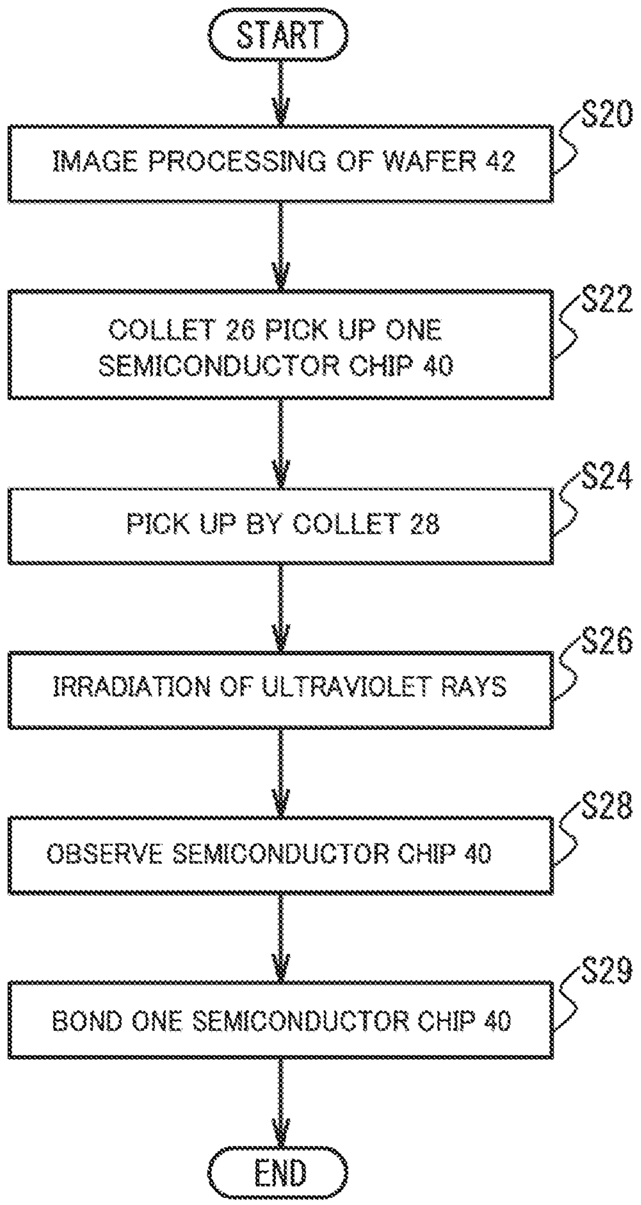
FIG. 4 is a flowchart illustrating a step of bonding using the bonding device.

FIGS. 3 and 4 are flowcharts illustrating a step of bonding using the bonding device 100.

As illustrated in FIG. 3, for example, an operator sets the plurality of semiconductor chips 40 inside the housing 10 of the bonding device 100 (step S10) and further sets the wafer 42 (step S12). As illustrated in FIG. 2A, the semiconductor chip 40 is placed on the grip ring supplier 19. As illustrated in FIG. 2B, the wafer 42 is placed on the bonding stage 14. The bonding device 100 bonds one semiconductor chip 40 to the wafer 42 (step S14). The controller 30 determines whether the semiconductor chips 40 have been bonded to all the bonding positions on the wafer 42 (step S16). If the determination is negative (No), the bonding is performed again. If the determination is affirmative (Yes), the process is terminated.

FIG. 4 illustrates a step of bonding one semiconductor chip 40 to the wafer 42, which is performed in step S14 of FIG. 3. The camera 24 observes the surface 42_a_ of the wafer 42. The controller 30 performs image processing. The controller 30 acquires an image captured by the camera 24, and detects the position of the region 42_b_ in accordance with the position of an alignment mark provided around the planned bonding position in the wafer 42, for example (step S20). The collet 26 attracts and holds one of the plurality of semiconductor chips 40 on the grip ring supplier 19. The collet 26 picks up the sucked semiconductor chip 40 from the grip ring supplier 19 (step S22). The collet 26 conveys the picked up semiconductor chip 40 above the chip stage 20. The collet 26 stops the attraction and places the semiconductor chip 40 on the chip stage 20.

The collet 28 moves to the chip stage 20, and picks up the semiconductor chip 40 on the chip stage 20 (step S24). Then, the collet 28 conveys the semiconductor chip 40 above the ultraviolet irradiator 16. The ultraviolet irradiator 16 irradiates the surface of the semiconductor chip 40 with ultraviolet rays (step S26). After step S26, the collet 28 conveys the semiconductor chip 40 above the camera 18. The camera 18 observes the semiconductor chip 40 attracted to the collet 28, and the controller 30 acquires the image captured by the camera 18 (step S28). The controller 30 performs image processing, and then rotates the collet 28 around the Z-axis direction as a rotation axis, for example, and adjusts the position of the semiconductor chip 40 in the XY-plane.

The collet 28 conveys the semiconductor chip 40 to the bonding stage 14, brings the semiconductor chip 40 into contact with the surface of the wafer 42, and loads the semiconductor chip 40. The semiconductor chip 40 is bonded to the wafer 42 (step S29). Thus, the process of FIG. 4 is completed.

After the process illustrated in FIG. 4 is performed on one semiconductor chip 40, the process illustrated in FIG. 4 is performed on another semiconductor chip 40. When the process illustrated in FIG. 4 is performed for each of the plurality of semiconductor chips 40 set in the bonding device 100, the process illustrated in FIG. 3 is completed. Another plurality of semiconductor chips 40 and another wafer 42 are set in the bonding device 100 (steps S10 and S12), and the processes of FIGS. 3 and 4 are repeated again. After the steps of FIGS. 3 and 4, the bonding strength may be further increased by heating the semiconductor chip 40 and the wafer 42 and applying the load.

Figure 5:
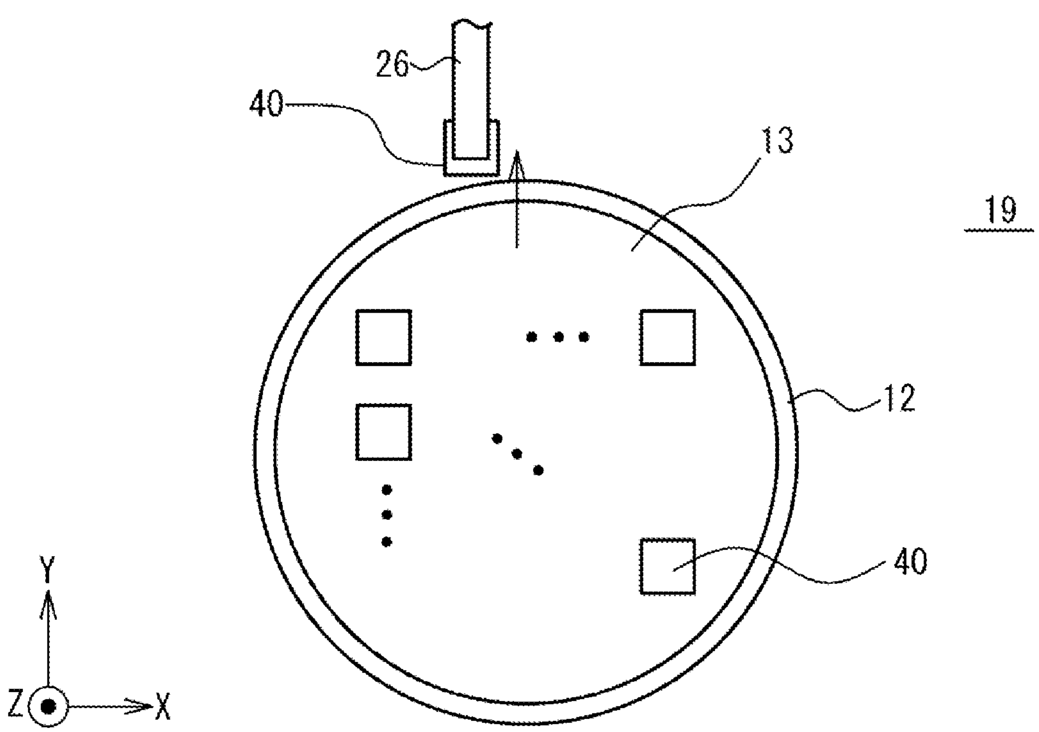
FIG. 5 is a plan view illustrating the grip ring supplier.

FIG. 5 is a plan view illustrating the grip ring supplier 19, and illustrates a step in which the semiconductor chip 40 is picked up from the grip ring supplier 19 (step S22 in FIG. 4). As illustrated in FIG. 5, the plurality of semiconductor chips 40 are arranged on the adhesive tape 13 of the grip ring supplier 19. A surface 40_a_ of the semiconductor chip 40 is adhered to the adhesive tape 13. The collet 26 attracts one semiconductor chip 40, removes it from the adhesive tape 13, and conveys the semiconductor chip 40 to the outside of the grip ring supplier 19.

Figure 6A:
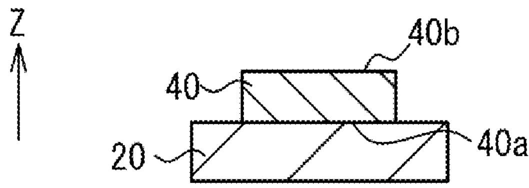
FIG. 6A is a cross-sectional view illustrating the chip stage.
Figure 6B:
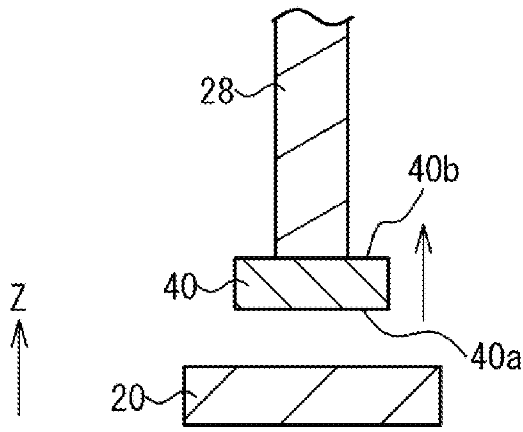
FIG. 6B is a cross-sectional view illustrating the chip stage.

FIGS. 6A and 6B are cross-sectional views illustrating the chip stage 20 and illustrates the pickup of the semiconductor chip 40 by the collet 28 (step S24). As illustrated in FIG. 6A, the semiconductor chip 40 conveyed from the grip ring 12 is placed on the chip stage 20. The surface 40*a* of the semiconductor chip 40 faces the chip stage 20, and surface 40*b* faces away from surface 40*a* (upper direction in FIG. 6A).

As illustrated in FIG. 6B, the collet 28 holds the semiconductor chip 40 by attracting the semiconductor chip 40. The collet 28 picks up the attracted semiconductor chip 40 from the chip stage 20. The surface 40*b* of semiconductor chip 40 is in contact with the collet 28. The surface 40*a* is not in contact with the collet 28 and faces away from the collet 28.

Figure 7A:
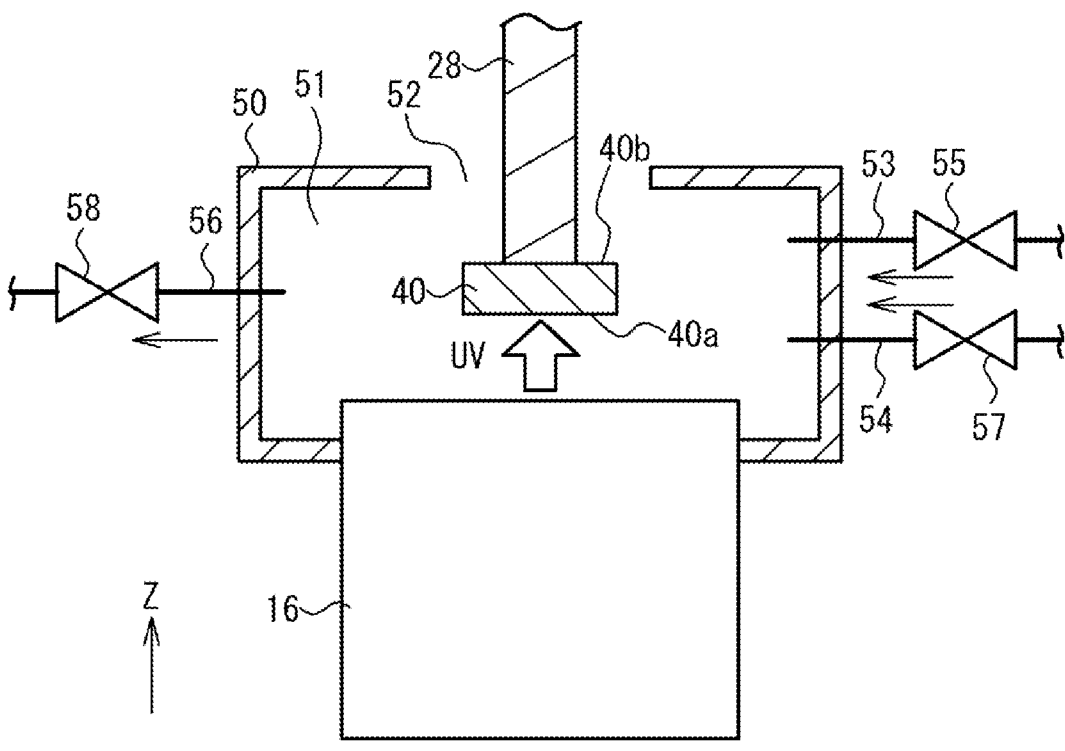
FIG. 7A is a schematic diagram illustrating irradiation with ultraviolet rays.

FIG. 7A is a schematic diagram illustrating irradiation of ultraviolet rays. A cover 50 is attached to the upper side of the ultraviolet irradiator 16. A cavity 51 is defined inside the cover 50. The cover 50 is made of, for example, aluminum (Al). The cover 50 has an opening 52. The opening 52 is provided in the upper wall of the cover 50 and penetrates the wall.

Gas passages 53, 54 and 56 are attached to the cover 50. The gas passages 53 and 54 are connected to, for example, gas tanks (not illustrated) and communicate with the inside of the cover 50. The gas passage 56 communicates with the inside of the cover 50. A valve 55 is provided in the gas passage 53. A valve 57 is provided in the gas passage 54. A valve 58 is provided in the gas passage 56. The valve 57 and the valve 58 function as an adjuster for adjusting the oxygen concentration and the nitrogen concentration in the cover 50.

The collet 28 places the semiconductor chip 40 into the cavity 51 through the opening 52. The semiconductor chip 40 is attracted to and held by the collet 28. The surface 40*a* of the semiconductor chip 40 is opposed to the ultraviolet irradiator 16. The valves 55 and 57 are opened to introduce gas from the gas passages 53 and 54 into the interior of the cover 50. The gas contains oxygen ($O_2$) and nitrogen ($N_2$), and may be air or the like. The ultraviolet irradiator 16 emits ultraviolet rays in the Z-axis direction (step S26 in FIG. 4). The irradiation time is, for example, 1 to 60 seconds. Ozone is generated from oxygen in the gas by ultraviolet rays. When the surface 40*a* of the semiconductor chip 40 is exposed to ozone, the surface 40*a* is hydrophilized, and hydroxyl groups (—OH) are generated on the surface 40*a*. Since the surface 40*a* is in contact with the adhesive tape 13 (see FIG. 2A), organic dirt or the like may be adhered thereto. The irradiation of ultraviolet rays also has an effect of removing the organic dirt from the surface 40*a*. The valve 58 is opened and the gas in the cavity 51 is discharged from the gas passage 56.

Figure 7B:
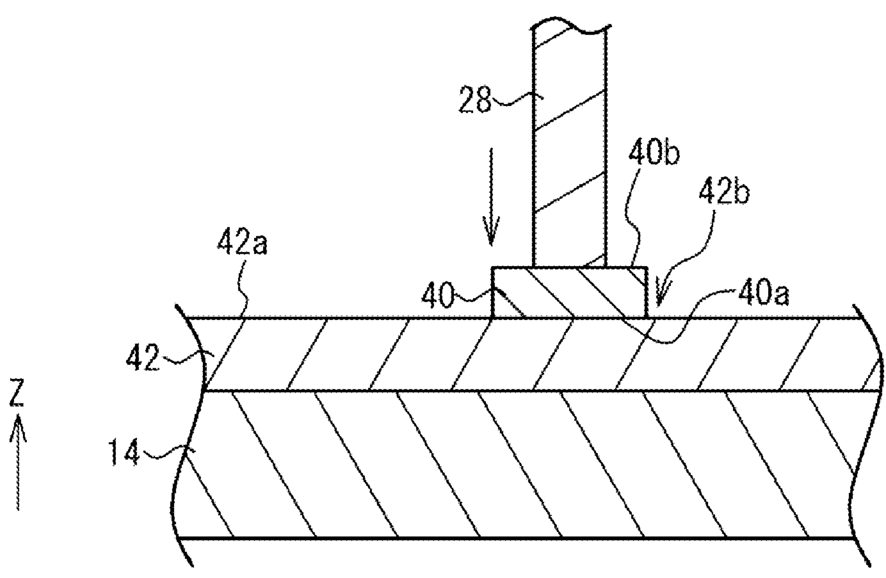
FIG. 7B is a cross-sectional view illustrating a step of bonding.

FIG. 7B is a cross-sectional view illustrating a step of bonding. As illustrated in FIG. 7B, the wafer 42 is placed on the bonding stage 14. The collet 28 conveys the semiconductor chip 40 above one region 42*b* of the wafer 42 and lowers the semiconductor chip 40 toward the wafer 42. The surface 40*a* of the semiconductor chip 40 is in contact with the surface 42*a* of the wafer 42. The collet 28 applies a downward load to the semiconductor chip 40, so that the semiconductor chip 40 is bonded to the wafer 42 (step S29 in FIG. 4).

In step S29 of FIG. 4, one semiconductor chip 40 is bonded on one of the plurality of regions 42*b* of FIG. 2B. When the process of FIG. 4 is repeated, the semiconductor chip 40 is bonded on each of the plurality of regions 42*b*.

Figure 8A:
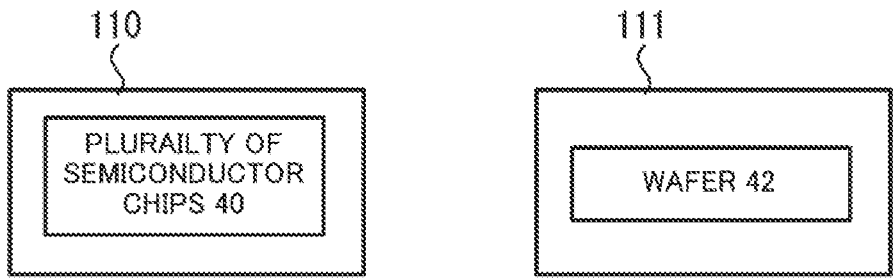
FIG. 8A is a schematic diagram illustrating equipment for bonding in a comparative example.

FIG. 8A is a schematic diagram illustrating equipment for bonding in a comparative example. In the comparative example, a device 110 for hydrophilization and a device 111 for bonding are used. The device for hydrophilization is, for example, a plasma irradiation device or an ultraviolet irradiation device, and does not have a bonding function. The device 111 for bonding is a device having, for example, a stage and a facility for pressing, and does not have a function of hydrophilizing. The plurality of semiconductor chips 40 are set in the device 110 for hydrophilization. The wafer 42 is set in the device 111 for bonding.

Figure 8B:
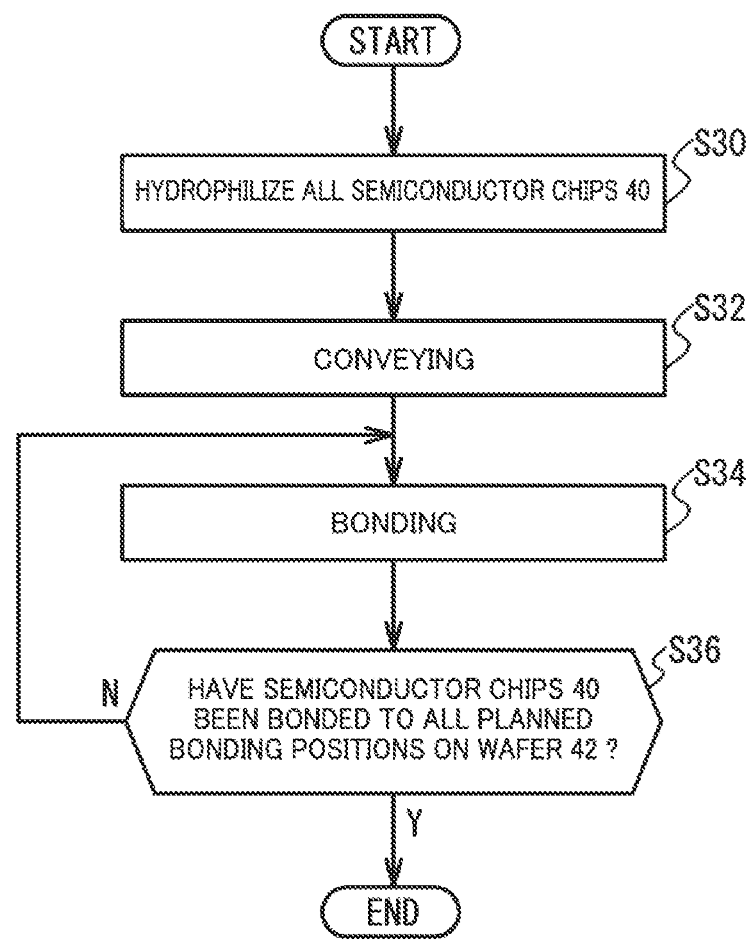
FIG. 8B is a flowchart illustrating a step of bonding in the comparative example.

FIG. 8B is a flowchart illustrating a step of bonding in the comparative example. The device 110 for hydrophilization hydrophilizes all of the semiconductor chips 40 (step S30). For example, the operator transfers the plurality of semiconductor chips 40 from the device 110 for hydrophilization to the device 111 for bonding (step S32). The device 111 for bonding bonds the semiconductor chips 40 to the wafer 42 one by one (step S34). Step S34 is repeated until the semiconductor chips 40 are bonded to all the planned bonding positions on the wafer 42 (step S36).

When the semiconductor chip 40 is taken out from the device for hydrophilization and transported to the device for bonding, the dust may adhere to the semiconductor chip 40. Since hydrophilization and bonding are carried out in separate equipment, it takes a long time from hydrophilization to bonding. A longer period of time after hydrophilization reduces the hydrophilization performance. It may take, for example, several tens of minutes or several hours from hydrophilization to bonding. As the hydrophilization performance deteriorates, the bonding strength also decreases. Although the plurality of semiconductor chips 40 are hydrophilized at the same time, they are bonded one by one. Among the plurality of semiconductor chips 40, a difference occurs in the time from hydrophilization to bonding. Therefore, the bonding strength varies.

According to the first embodiment, the bonding device 100 hydrophilizes the surface 40*a* of the semiconductor chip 40 by irradiating the semiconductor chip 40 with ultraviolet rays from the ultraviolet ray irradiator 16. The collet 28 of the bonding device 100 conveys the hydrophilized semiconductor chip 40 onto the wafer 42 and brings the surface 40*a* of the semiconductor chip 40 into contact with the surface 42*a* of the wafer 42. When the hydrophilized surface 40*a* and the surface 42*a* are in contact with each other, the semiconductor chip 40 is bonded to the wafer 42. The semiconductor chip 40 is hydrophilized and bonded to the wafer 42 by one bonding device 100. Since the semiconductor chip 40 is not taken out of the bonding device 100 from hydrophilization to bonding, the adhesion of dust to the semiconductor chip 40 is suppressed. The time from hydrophilization to bonding is shorter than that of the comparative example, for example, 5 seconds and 10 seconds or less. The deterioration of the hydrophilization performance with the passage of time after hydrophilization is suppressed. The decrease in bonding strength between the semiconductor chip 40 and the wafer 42 can be suppressed.

Ozone is generated by irradiation of ultraviolet rays, and the surface 40*a* is hydrophilized by ozone. Since plasma is not used, damage to the surface 40*a* is suppressed and the flatness of the surface 40*a* is improved. Since the flat surface 40*a* and the surface 42*a* are bonded together, the bonding strength is increased. Since plasma is not used, the inside of the bonding device 100 need not be a vacuum environment. Since there is no need to provide equipment for vacuum drawing, the bonding device 100 can be reduced in size.

As illustrated in FIGS. 2A and 2B, the plurality of semiconductor chips 40 and the single wafer 42 are set in the bonding device 100. The bonding device 100 performs hydrophilization and bonding of one semiconductor chip 40 out of the plurality of semiconductor chips 40 to the wafer 42 continuously (see FIG. 4), and then performs hydrophilization and bonding of the other semiconductor chip 40 (see FIG. 3). Each of the plurality of semiconductor chips 40 is bonded to the wafer 42 immediately after the hydrophilization. In the plurality of semiconductor chips 40, the deterioration of the hydrophilization performance is suppressed. With respect to each of the plurality of semiconductor chips 40, the time from hydrophilization to bonding is, for example, 10 seconds or less, so that the variation in time is small. Variations in hydrophilization performance are also reduced, and variations in bonding strength of the plurality of semiconductor chips 40 to the wafer 42 are suppressed.

The bonding device 100 has the grip ring supplier 19 and the bonding stage 14. The plurality of semiconductor chips 40 are placed on the grip ring supplier 19. The wafer 42 is placed on the bonding stage 14. The collet 26 picks up one semiconductor chip 40 from the grip ring supplier 19 and conveys it to the chip stage 20. The collet 28 picks up the semiconductor chip 40 from the chip stage 20, conveys the semiconductor chip 40 to the ultraviolet irradiator 16, the camera 18, and the bonding stage 14, and bonds the semiconductor chip 40 to the wafer 42. The distance from the grip ring supplier 19 to the ultraviolet irradiator 16 and the distance from the ultraviolet irradiator 16 to the bonding stage 14 are, for example, 1 m or less, 50 cm or the like. Since the distance over which the semiconductor chip 40 is conveyed is short, the step from hydrophilization to bonding can be performed quickly. Since the adhesion of dust is suppressed and the deterioration of the hydrophilization performance with passage of time is suppressed, the bonding strength is increased.

The housing 10 houses the grip ring supplier 19, the bonding stage 14, the chip stage 20, the cameras 18 and 24, the gel pack supplier 22, and the collets 26 and 28. The plurality of semiconductor chips 40 and the wafer 42 can be set in one bonding device 100, and irradiation of ultraviolet rays and bonding can be carried out in one bonding device 100. Since the adhesion of dust is suppressed and the deterioration of the hydrophilization performance with passage of time is suppressed, the bonding strength is increased.

It is preferable that the clean booth unit 11 keeps the dust count inside the housing 10 low. The adhesion of dust and dirt to the surface of the semiconductor chip 40 and the surface of the wafer 42 can be suppressed, and both surfaces can be bonded in a clean state.

As illustrated in FIG. 7A, the bonding device 100 includes the cover 50. The gas containing oxygen is introduced into the cavity 51 in the cover 50. The ultraviolet irradiator 16 irradiates the semiconductor chip 40 arranged in the cavity 51 with ultraviolet rays. When the ultraviolet rays react with the gas in the cavity 51, ozone is generated. The surface 40*a* of the semiconductor chip 40 is hydrophilized by ozone. By covering the ultraviolet irradiator 16 with the cover 50, the concentration of ozone inside the cover 50 becomes higher than the concentration of ozone outside the cover 50, so that hydrophilization can be effectively performed. For example, hydrophilization is possible in a time of several tens of seconds. The cover 50 is preferably made of a material such as aluminum that is not easily deteriorated by ultraviolet rays.

The controller 30 controls the opening degree of the valves 55, 57 and 58 illustrated in FIG. 7A. When the valve 55 is opened, oxygen is supplied into the cover 50. When the valve 57 is opened, nitrogen is supplied into the cover 50. The oxygen concentration in the cover 50 changes in accordance with the opening degree of the valve 55 and the opening degree of the valve 57, and the ozone concentration also changes. As the oxygen concentration increases, the ozone concentration also increases. By observing the quantity of ultraviolet rays inside the cover 50, the ozone concentration can be known. The opening of the valve is adjusted so that the ozone concentration becomes high, and the oxygen concentration is adjusted. The higher the ozone concentration is, the more hydrophilization is promoted, and the lower the ozone concentration is, the less hydrophilization is promoted. By increasing the ozone concentration, hydrophilization can be performed quickly and the irradiation time of ultraviolet rays can be shortened.

In the case where the surface 40*a* of the semiconductor chip 40 is in contact with the adhesive tape 13, when the semiconductor chip 40 is placed on the chip stage 20, the surface 40*b* faces upward and the surface 40*a* faces downward. The collet 28 attracts the semiconductor chip 40 from the surface 40*b*, and picks up the semiconductor chip 40. The surface 40*b* opposite to the surface 40*a* may contact the adhesive tape 13. In this case, the collet 26 attracts the surface 40*a* and picks up the semiconductor chip 40. For example, in the chip stage 20, another collet is used to invert the semiconductor chip 40 so that the surface 40*b* faces upward and the surface 40*a* faces downward. The collet 28 attracts the surface 40*b* and picks up the semiconductor chip 40.

The semiconductor chip 40 is formed of compound semiconductor, and the surface 40*a* is formed of indium phosphorus (InP), for example. The surface 42*a* of the wafer 42 is formed of silicon (Si). Bonding different materials is more difficult than bonding the same materials. According to the first embodiment, since the bonding is performed immediately after the hydrophilization of the surface 40*a*, the bonding can be performed with high strength.

The semiconductor chip 40 may be formed of a group III-V compound semiconductor such as InP, or may be formed of a compound semiconductor other than a group III-V compound semiconductor. The wafer 42 may be formed of a material other than Si. The bonding device 100 may bond components made of, for example, metal or plastic other than semiconductors. The bonding device 100 may be used for bonding the same material. For example, the bonding device 100 may bond two silicon wafers or may bond two compound semiconductors.

Second Embodiment

Figure 9:
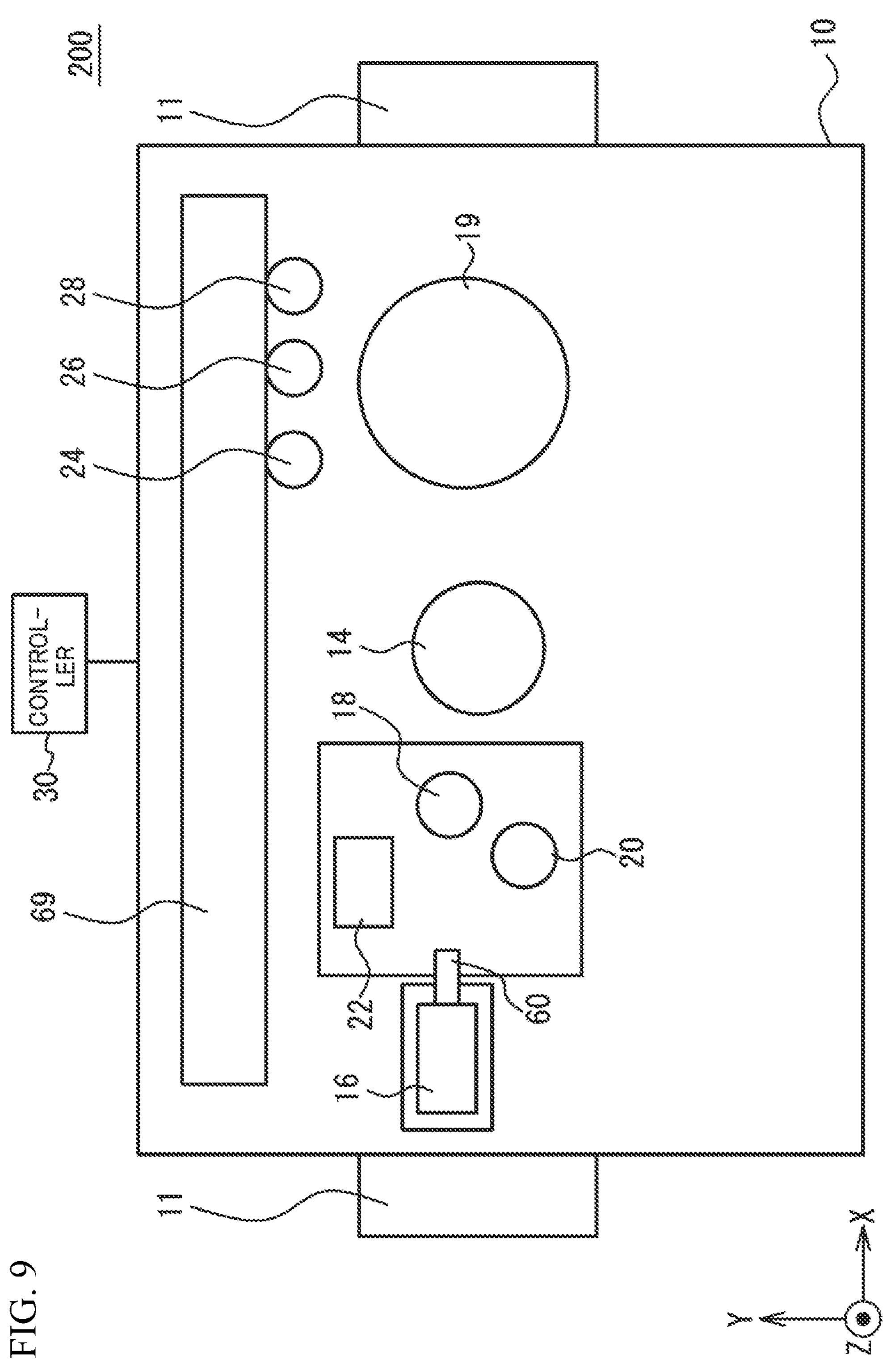
FIG. 9 is a schematic diagram illustrating a bonding device according to a second embodiment.

FIG. 9 is a schematic diagram illustrating a bonding device 200 according to the second embodiment. Description of the same configuration as that of the first embodiment is omitted. Also in the second embodiment, the processes illustrated in FIGS. 3 and 4 are performed. As illustrated in FIG. 9, the bonding device 200 has a reflector 60. The reflector 60 is disposed at a position facing the ultraviolet irradiator 16. The ultraviolet irradiator 16 emits ultraviolet rays in the X-axis direction.

Figure 10:
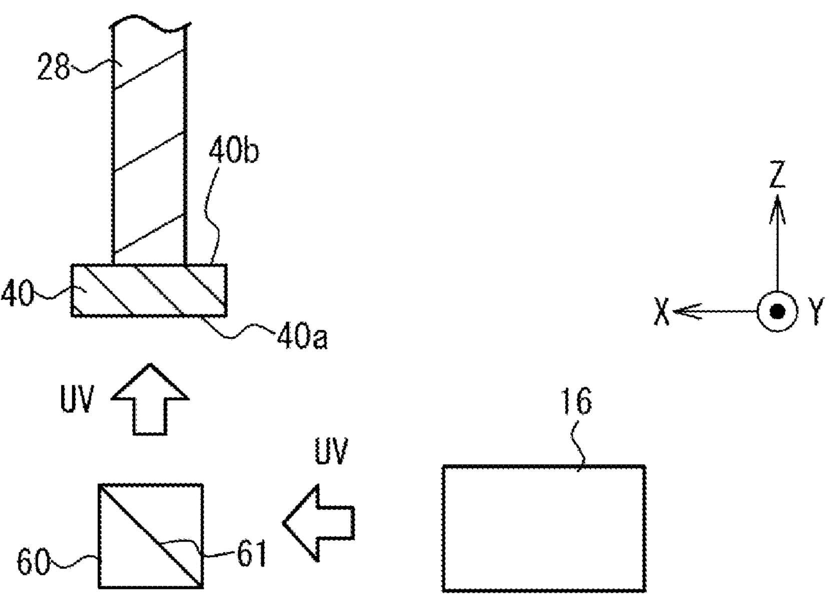
FIG. 10 is a diagram illustrating a step of irradiating ultraviolet rays.

FIG. 10 is a diagram illustrating a step of irradiating ultraviolet rays. The reflector 60 is a block-shaped member made of quartz or the like, for example. The outer wall of the reflector 60 is covered with an antireflection (AR) film. The reflector 60 has a reflection film 61. The reflection film 61 is a total reflection film and is inclined by 45 degrees with respect to the X-axis direction and the Z-axis direction, for example. Similarly to FIG. 7A, the semiconductor chip 40 and the reflector 60 may be covered with the cover, and the gas containing oxygen may be supplied into the cover.

As illustrated in FIG. 10, the collet 28 conveys the semiconductor chip 40 above the reflector 60. In the Z-axis direction, the surface 40*a* of the semiconductor chip 40 faces the reflection film 61. The ultraviolet irradiator 16 and the reflector 60 are opposed to each other in the X-axis direction. The ultraviolet irradiator 16 irradiates the reflector 60 with ultraviolet rays. The reflection film 61 of the reflector 60 reflects ultraviolet rays in the Z-axis direction. The surface 40*a* of the semiconductor chip 40 is irradiated with the reflected ultraviolet ray (step S26 in FIG. 4). The surface 40*a* is hydrophilized. After hydrophilization, the bonding is performed as illustrated in FIG. 7B.

According to the second embodiment, the adhesion of dust to the surface 40*a* and the deterioration of the hydrophilization performance are suppressed, so that the decrease in bonding strength can be suppressed. Since plasma is not used, damage to the surface 40*a* is suppressed and the flatness of the surface 40*a* is improved. Since the flat surface 40*a* and the surface 42*a* are bonded together, the bonding strength is increased.

As described in the first and second embodiments, the arrangement of the ultraviolet irradiator 16 can be changed. The degree of freedom in the arrangement of each component inside the bonding device 200 is increased.

Third Embodiment

Figure 11:
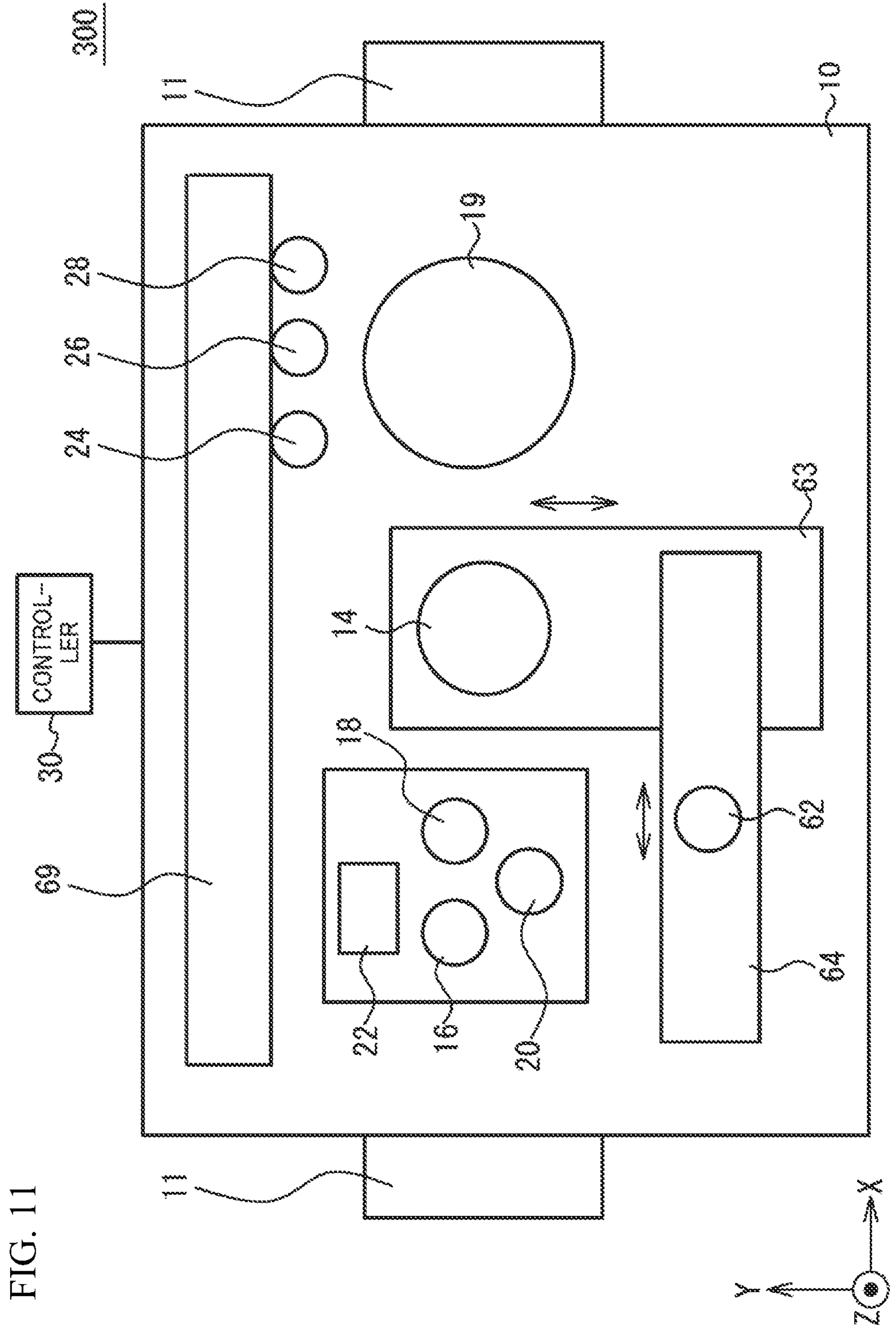
FIG. 11 is a schematic diagram illustrating a bonding device according to a third embodiment.

FIG. 11 is a schematic diagram illustrating a bonding device 300 according to a third embodiment. Description of the same configuration as that of the first and second embodiments is omitted. Also in the third embodiment, the processes illustrated in FIGS. 3 and 4 are performed.

As illustrated in FIG. 11, the bonding device 300 has the ultraviolet irradiator 16 (first irradiator), an ultraviolet irradiator 62 (second irradiator), and movable parts 63 and 64. In the third embodiment, both the semiconductor chip 40 and the wafer 42 are irradiated with ultraviolet rays (step S26 in FIG. 4). The ultraviolet irradiator 16 irradiates the semiconductor chip 40 with ultraviolet rays as in the example of FIG. 7A. The ultraviolet irradiator 62 irradiates the wafer 42 with ultraviolet rays.

The movable parts 63 and 64 are rails, for example, and can move a mounted object. The bonding stage 14 is mounted on the movable part 63. The movable part 63 moves the bonding stage 14 and the wafer 42 in the Y-axis direction. The ultraviolet irradiator 62 is mounted on the movable part 64. The movable part 64 moves the ultraviolet irradiator 62 in the X-axis direction. When the wafer 42 is irradiated with ultraviolet rays, the wafer 42 and the ultraviolet irradiator 62 are opposed to each other in the Z-axis direction.

Figure 12:
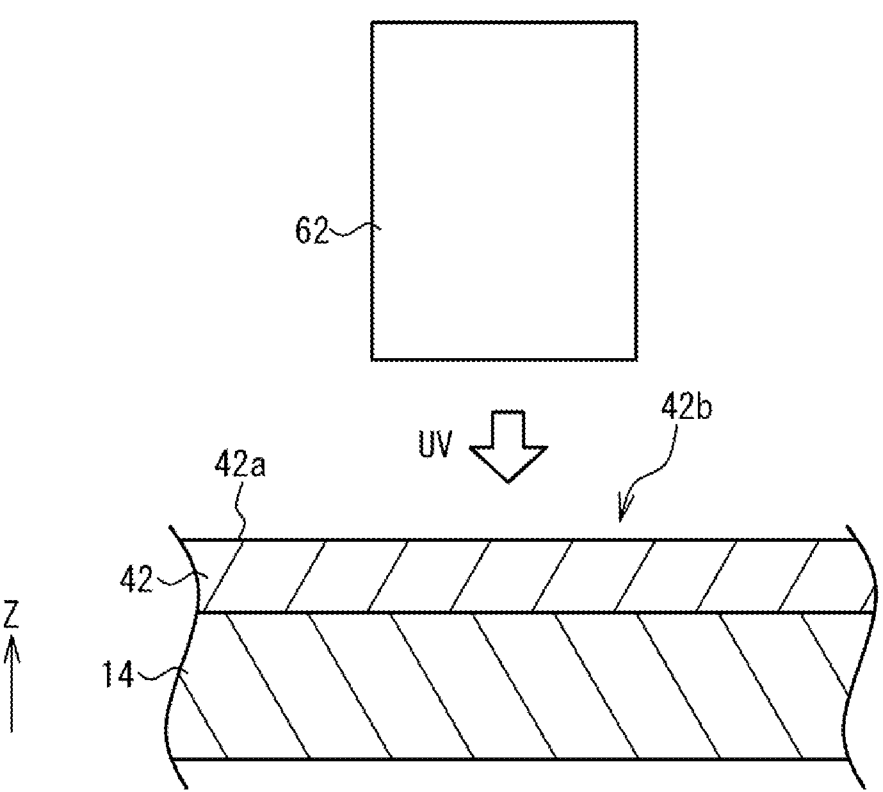
FIG. 12 is a schematic diagram illustrating irradiation with ultraviolet rays.

FIG. 12 is a schematic diagram illustrating irradiation of ultraviolet rays. As illustrated in FIG. 12, the ultraviolet irradiator 62 is disposed above the wafer 42 and faces the surface 42*a* of the wafer 42. The ultraviolet irradiator 62 irradiates a portion of the surface 42*a* of the wafer 42 corresponding to one region 42*b* with ultraviolet rays. Ozone is generated by ultraviolet rays, a region corresponding to one region 42*b* of the surface 42*a* is hydrophilized by the ozone, and hydroxyl groups (—OH) are generated on the surface of the region. As illustrated in FIG. 7A, when the ultraviolet irradiator 16 irradiates the semiconductor chip 40 with ultraviolet rays, the surface 40*a* is hydrophilized and hydroxyl groups are generated. After hydrophilization of the two surfaces, they are bonded together as illustrated in FIG. 7B.

The movable part 63 moves the wafer 42 together with the bonding stage 14 from below the ultraviolet irradiator 62. As illustrated in FIG. 7B, the collet 28 conveys the semiconductor chip 40 and bonds it to the wafer 42.

According to the third embodiment, both surfaces of the semiconductor chip 40 and the wafer 42 are irradiated with ultraviolet rays to hydrophilize both surfaces. The semiconductor chip 40 is bonded to the wafer 42 by bringing the hydrophilized surface 40*a* and the hydrophilized surface 42*a* into contact with each other. Since the two surfaces are hydrophilized, the bonding strength is improved.

After one semiconductor chip 40 is hydrophilized and one of the plurality of regions 42*b* of the wafer 42 is hydrophilized, the semiconductor chip 40 is bonded to the hydrophilized region 42*b*. Since the bonding is performed immediately after hydrophilization, the adhesion of dust is suppressed, the deterioration of the hydrophilization performance with passage of time is suppressed, and the bonding strength is increased.

As illustrated in FIGS. 3 and 4, the plurality of semiconductor chips 40 are bonded together. All of the plurality of semiconductor chips 40 are bonded to the wafer 42 immediately after surface 40*a* and surface 42*a* are hydrophilized. In the plurality of semiconductor chips 40, the deterioration of the hydrophilization performance is suppressed. With respect to the plurality of semiconductor chips 40, the time from the hydrophilization to the bonding is, for example, 10 seconds or less, and variations of the time is small. Variations in hydrophilization performance are also reduced, and variations in bonding strength of the plurality of semiconductor chips 40 to the wafer 42 are suppressed.

Fourth Embodiment

Figure 13:
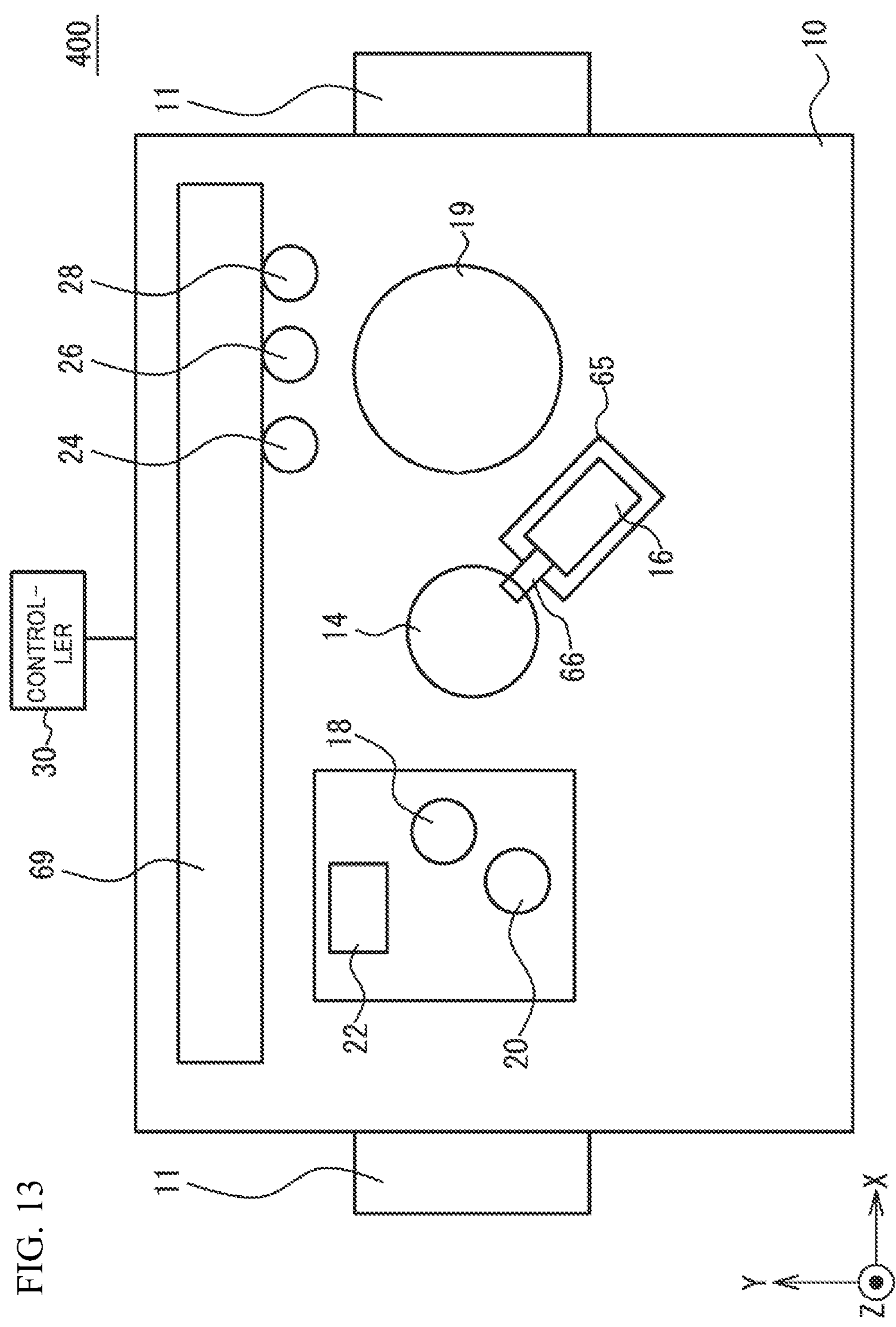
FIG. 13 is a schematic diagram illustrating a bonding device according to a fourth embodiment.

FIG. 13 is a schematic diagram illustrating a bonding device 400 according to a fourth embodiment. Description of the same configuration as that of the first to third embodiments is omitted. Also in the fourth embodiment, the processes illustrated in FIGS. 3 and 4 are performed.

As illustrated in FIG. 13, the bonding device 400 has the ultraviolet irradiator 16, a movable part 65, and a brancher 66. The ultraviolet irradiator 16 is mounted on the movable part 65. The brancher 66 is connected to the movable part 65. The movable part 65 is a rail, for example, and can move the ultraviolet irradiator 16 and the brancher 66.

Figure 14:
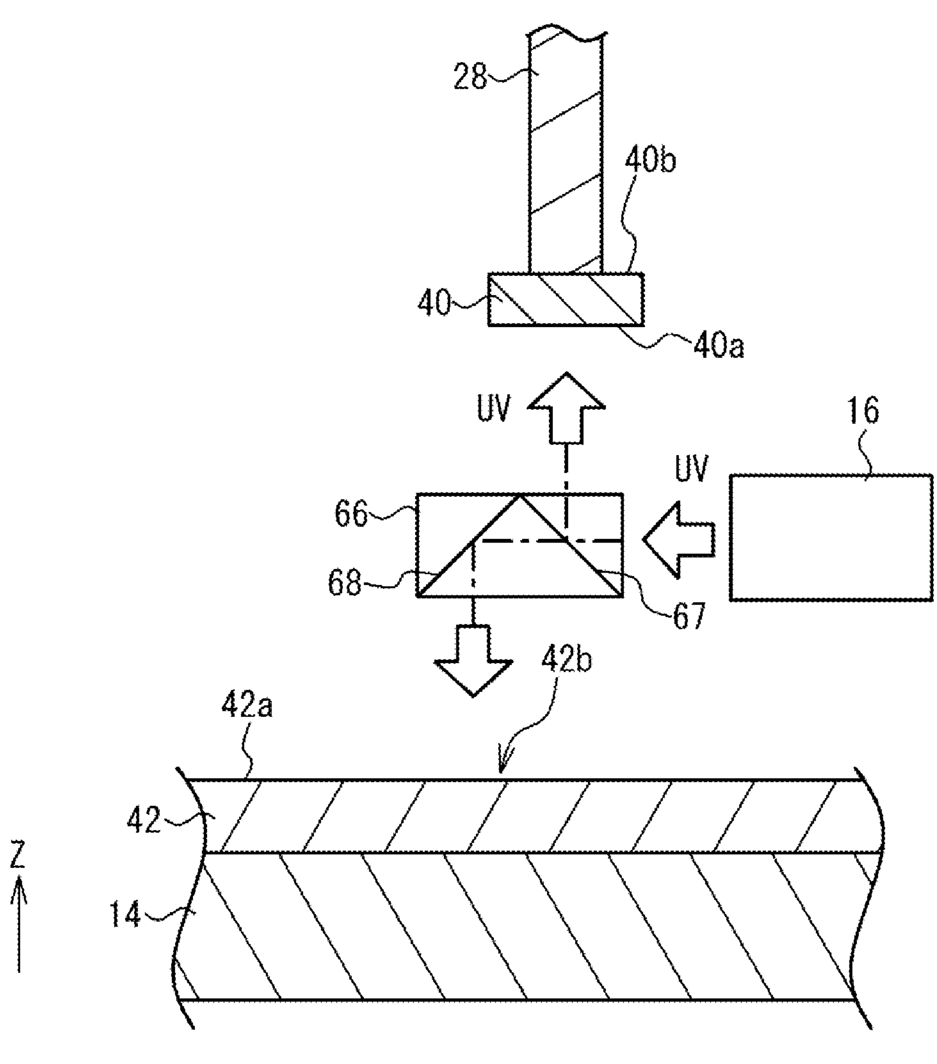
FIG. 14 is a schematic diagram illustrating a step of irradiating ultraviolet rays.

FIG. 14 is a schematic diagram illustrating a step of irradiating ultraviolet rays. The brancher 66 is a block-shaped member made of quartz or the like, for example. The outer wall of the brancher 66 is covered with an antireflection film. The brancher 66 has a half mirror 67 and a reflection film 68. The half mirror 67 is inclined with respect to the Z-axis direction. The reflection film 68 is a total reflection film and is inclined opposite to the half mirror 67 with respect to the Z-axis direction. The half mirror 67 and the reflection film 68 are plane-symmetric with respect to a plane parallel to the Z-axis.

The ultraviolet irradiator 16 and the brancher 66 are positioned between the semiconductor chip 40 and the wafer 42 in the Z-axis direction. The collet 28 conveys the semiconductor chip 40 above the half mirror 67. The half mirror 67 faces the surface 40*a* of the semiconductor chip 40. The reflection film 68 faces the surface 42*a* of the wafer 42. The ultraviolet irradiator 16 irradiates the brancher 66 with ultraviolet rays. The half mirror 67 reflects approximately half of the ultraviolet rays toward the surface 40*a* and transmits approximately half of the ultraviolet rays. The transmitted ultraviolet rays are reflected by the reflection film 68 and irradiated on the surface 42*a*. By the irradiation of ultraviolet rays, the surfaces 40*a* and 42*a* are hydrophilized (step S26 in FIG. 4). After the hydrophilization, bonding is performed as illustrated in FIG. 7B.

According to the fourth embodiment, by branching ultraviolet rays by the brancher 66, the semiconductor chip 40 and the wafer 42 are simultaneously irradiated with ultraviolet rays, and the two surfaces are simultaneously hydrophilized. The semiconductor chip 40 is bonded to the wafer 42 by bringing the hydrophilized surface 40*a* and the hydrophilized surface 42*a* into contact with each other. Since the two surfaces are hydrophilized, the bonding strength is improved.

After one semiconductor chip 40 is hydrophilized and one of the plurality of regions 42*b* of the wafer 42 is hydrophilized, the semiconductor chip 40 is bonded to the region 42*b*. Since the bonding is performed immediately after the hydrophilization, the adhesion of dust is suppressed, the deterioration of the hydrophilization performance with passage of time is suppressed, and the bonding strength is increased.

As illustrated in FIGS. 3 and 4, the plurality of semiconductor chips 40 are bonded together. All of the plurality of semiconductor chips 40 are bonded to the wafer 42 immediately after the surface 40*a* and the surface 42*a* are hydrophilized. With respect to the plurality of semiconductor chips 40, variations in time from hydrophilization to bonding are small. Variations in hydrophilization performance are also reduced, and variations in bonding strength of the plurality of semiconductor chips 40 to the wafer 42 are suppressed.

Fifth Embodiment

Figure 15A:
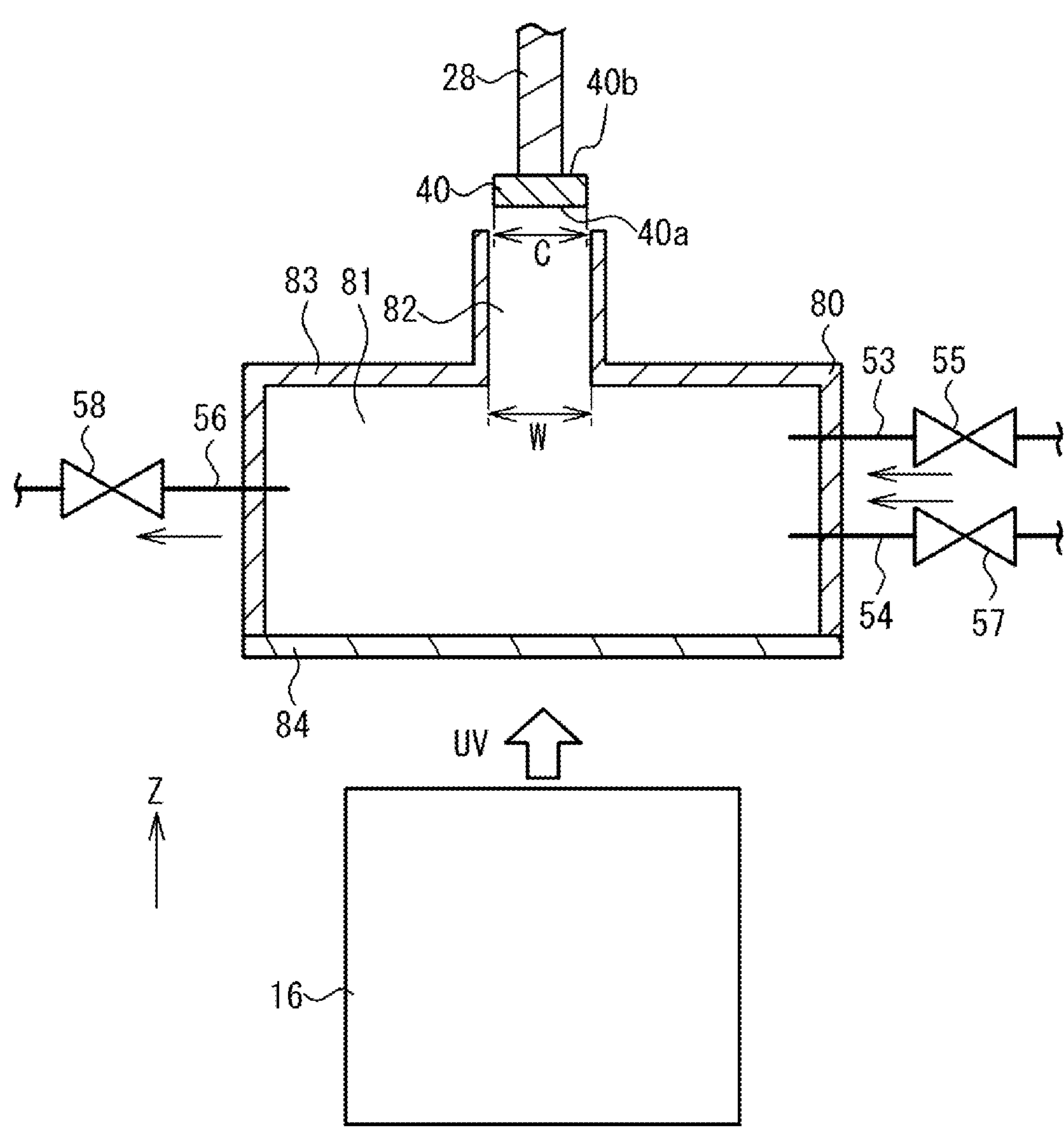
FIG. 15A is a schematic diagram illustrating irradiation of ultraviolet rays according to a fifth embodiment.

FIG. 15A is a schematic diagram illustrating irradiation of ultraviolet rays according to a fifth embodiment. Description of the same configuration as in any one of the first to fourth embodiments is omitted. In the fifth embodiment, in the bonding device 100 of the first embodiment, an irradiation pot 80 (cover) is attached above the ultraviolet irradiator 16 instead of the cover 50. A cavity 81 is defined inside the irradiation pot 80. The irradiation pot 80 has an upper surface irradiation port 82 (first opening) provided in an upper wall 83 (second wall) instead of the opening 52 illustrated in FIG. 7A. The upper surface irradiation port 82 is an opening having an area smaller than that of the opening 52. The irradiation pot 80 has, for example, a cylindrical shape. The upper wall 83 is made of, for example, aluminum (Al). A lower wall 84 (first wall) of the irradiation pot 80 faces the ultraviolet irradiator 16 and is formed of a material that transmits ultraviolet rays such as quartz. The lower wall 84 and the upper surface irradiation port 82 face each other.

The gas passages 53, 54 and 56 are attached to the irradiation pot 80. The valves 55, 57 and 58 are provided in the gas passages 53, 54 and 56, respectively.

The collet 28 places the semiconductor chip 40 above the upper surface irradiation port 82. The surface 40*a* of the semiconductor chip 40 faces the ultraviolet irradiator 16 with the irradiation pot 80 interposed therebetween. The valve 55 is opened to supply oxygen from the gas passage 53 to the cavity 81. The valve 57 is opened to supply nitrogen from the gas passage 54 to the cavity 81. The ultraviolet irradiator 16 emits ultraviolet rays in the Z-axis direction (step S26 in FIG. 4). Ozone is generated inside the cavity 81 by ultraviolet rays. The surface 40*a* of the semiconductor chip 40 is hydrophilized by being exposed to ozone emitted from the upper surface irradiation port 82. After hydrophilization, the collet 28 moves the semiconductor chip 40 toward the bonding stage 14.

In the fifth embodiment, the semiconductor chip 40 is hydrophilized without entering the cavity 81 in which ozone is generated. The semiconductor chip 40 and the collet 28 do not enter the cavity 81. The transmittance of ultraviolet rays of the lower wall 84 is higher than that of the upper wall 83. The ultraviolet irradiator 16 is located outside the irradiation pot 80, and the ultraviolet rays are transmitted through the lower wall 84. Mixing of outside air into the cavity 81 is suppressed, and generation of ozone inside the cavity 81 is stabilized.

Figure 15B:
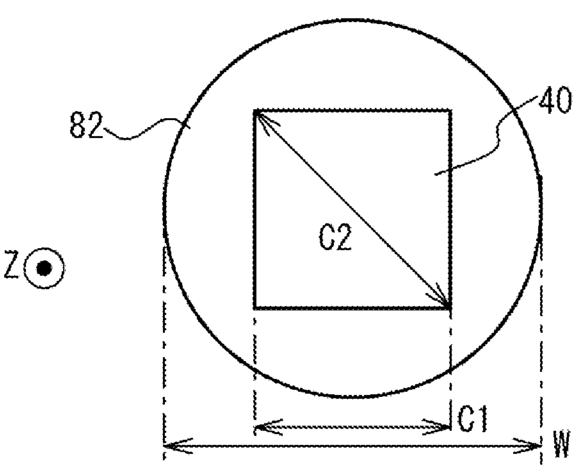
FIG. 15B is a top view of an upper irradiation port.

FIG. 15B is a top view of the upper surface irradiation port 82. The upper surface irradiation port 82 is, for example, circular. An opening width W of the upper surface irradiation port 82 is adjustable. If the opening width W is too small, oxygen in the air is consumed for ozone generation, and the effect of ozone generation is liable to fluctuate. By adjusting the opening width W, stability and durability of the ozone generation effect are improved.

The semiconductor chip 40 has a rectangular shape. The opening width (diameter) W of the upper surface irradiation port 82 is, for example, 10 mm, and is larger than a length C1 of one side of the semiconductor chip 40 and a length C2 of the diagonal line of the semiconductor chip 40. Thus, ozone can be brought into uniform contact with the surface 40*a* of the semiconductor chip 40. The diameter W is less than three times the length C2 of the diagonal line. Thus, excessive diffusion of ozone generated in the irradiation pot to the outside of the irradiation pot can be suppressed.

Sixth Embodiment

Figure 16A:
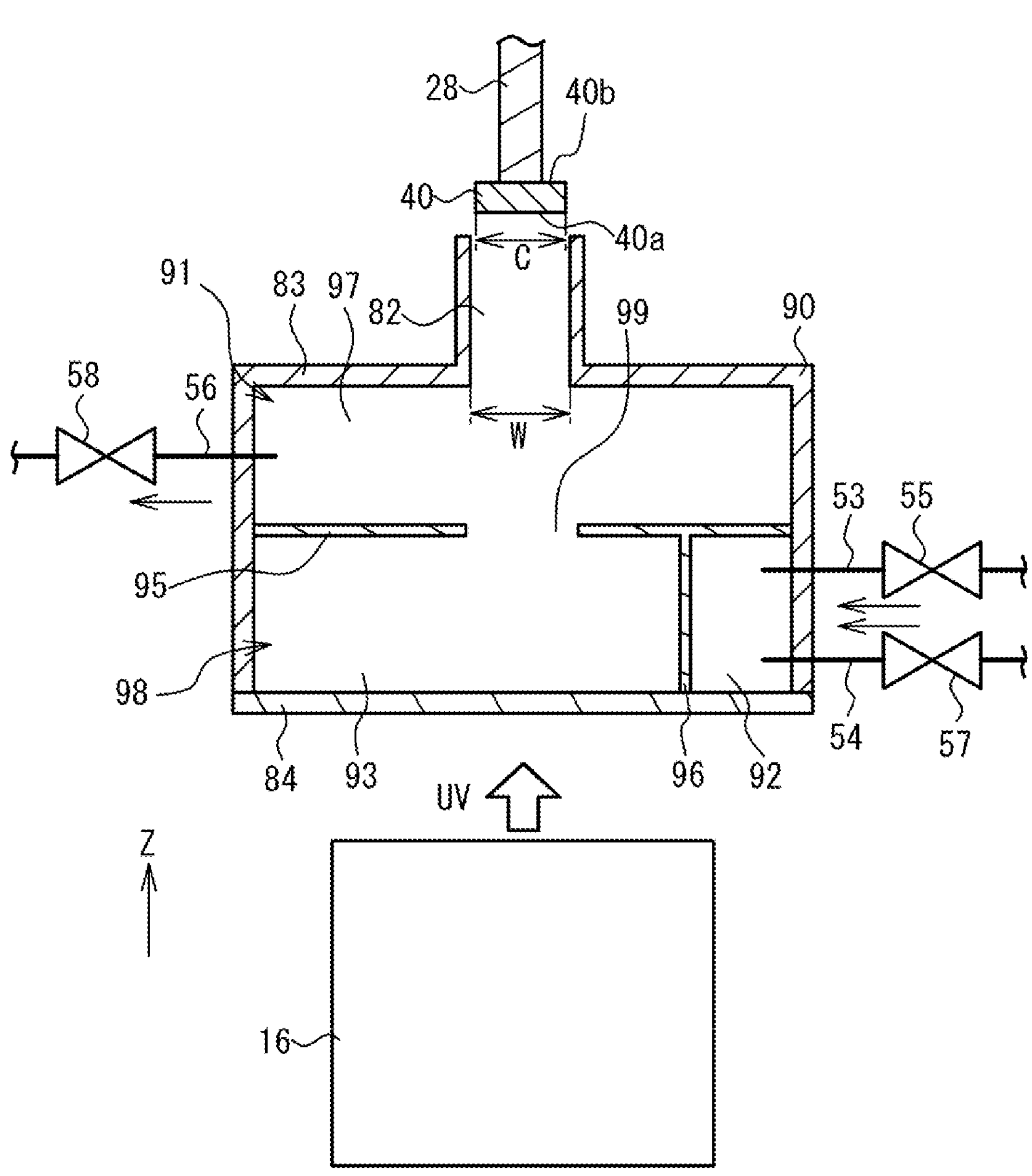
FIG. 16A is a schematic diagram illustrating an irradiation pot according to a sixth embodiment.
Figure 16B:
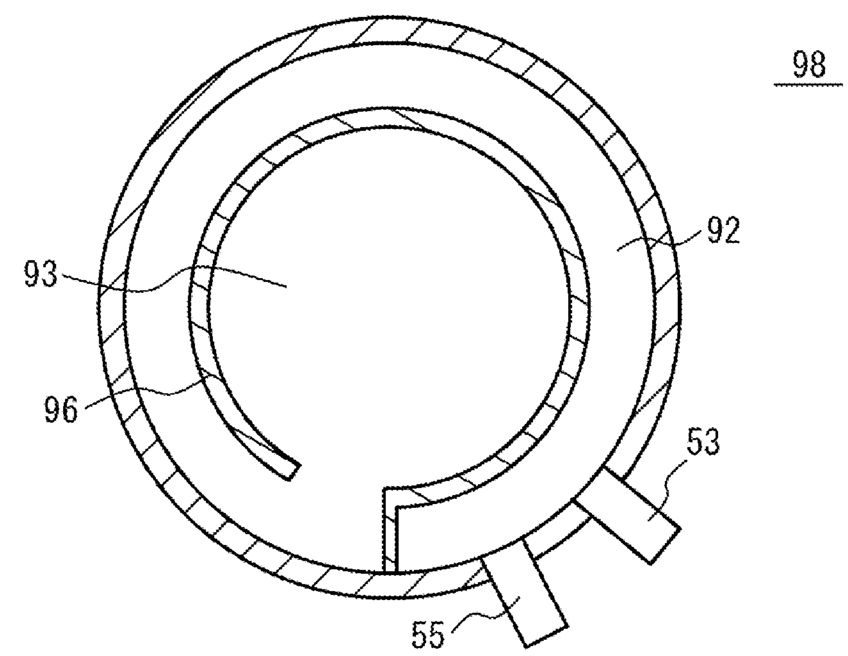
FIG. 16B is a schematic diagram illustrating an irradiation pot according to the sixth embodiment.
Figure 16C:
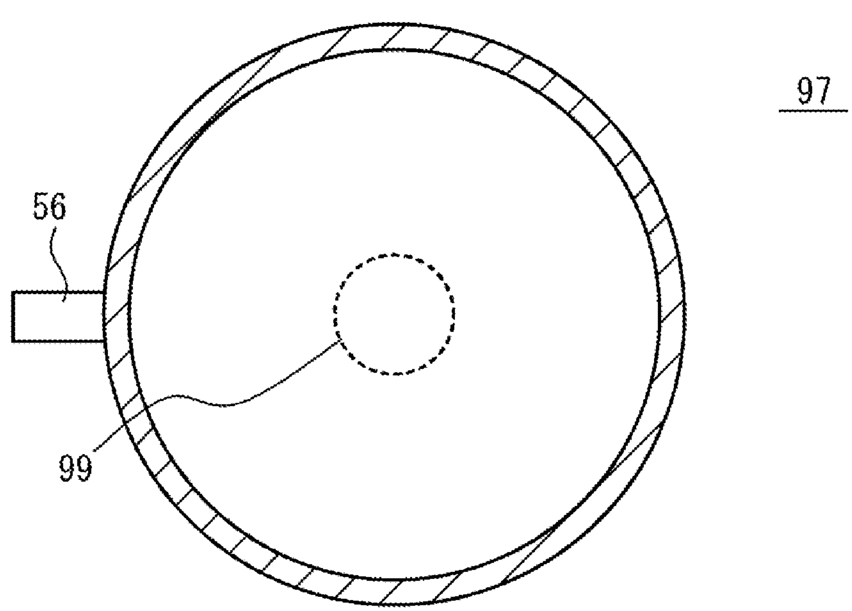
FIG. 16C is a schematic diagram illustrating an irradiation pot according to the sixth embodiment.

FIGS. 16A, 16B and 16C are schematic diagrams illustrating an irradiation pot 90 according to a sixth embodiment. FIG. 16A is a cross-sectional view of the irradiation pot 90. FIG. 16B is a view of a gas introducer 98 of the irradiation pot 90 as viewed from above, and illustrates the arrangement of an inner wall 96 in the gas introducer 98. FIG. 16C is a view of an exhauster 97 of the irradiation pot 90 as viewed from above. The irradiation pot 90 has the upper surface irradiation port 82, the upper wall 83, and the lower wall 84, and further has an inner wall 95 (first inner wall) and the inner wall 96 (second inner wall). The inner wall 95 and the inner wall 96 may be integral members or may be separable members.

As illustrated in FIG. 16A, the inner wall 95 has an opening 99 (second opening). The opening 99 faces the upper surface irradiation port 82. In the irradiation pot 90, the cavity 91 is partitioned into the exhauster 97 (first cavity) and the gas introducer 98 (second cavity) by the inner wall 95. The gas passages 53 and 54 are attached to the gas introducer 98. The gas passage 56 is attached to the exhauster 97. Oxygen and nitrogen introduced into the gas introducer 98 and ozone generated in the gas introducer 98 can flow to the exhauster 97 through the opening 99 of the inner wall 95.

As illustrated in FIGS. 16A and 16B, the inner wall 96 is provided inside the gas introducer 98. The inner wall 96 extends between the inner wall 95 and the lower wall 84.

As illustrated in FIG. 16B, the inner wall 96 is a curved plate extending along the outer wall (side surface) of the gas introducer 98. The inner wall 96 divides the gas introducer 98 into a cavity 92 (third cavity) and a cavity 93 (fourth cavity). The cavity 92 is located between the outer wall and the inner wall 96. The cavity 93 is a portion surrounded by the inner wall 96. The cavity 92 and the cavity 93 communicate with each other. The cavity 93 communicates with the exhauster 97 through the opening 99 of FIG. 16A.

The gas introduced from the gas passages 53 and 54 passes through the space (cavity 92) between the outer wall and the inner wall 96 of the gas introducer 98 and reaches a central portion (cavity 93) of the gas introducer 98. Ultraviolet rays are irradiated to the gas in the central portion of the gas introducer 98. As illustrated in FIG. 16C, the opening 99 is provided in the center of the inner wall 95. The gas reaching the central portion and the ozone generated by the ultraviolet irradiation reach the exhauster 97 through the opening 99 of the inner wall 95. A part of the ozone comes out from the upper surface irradiation port 82, and the surface 40*a* of the semiconductor chip 40 is exposed to the ozone. The gas and ozone are exhausted out of the irradiation pot 90 through the gas passage 56.

Positions where the gas passages 53 and 54 are attached to the irradiation pot is referred to as a gas introduction port, and a position where the gas passage 56 is attached to the irradiation pot is referred to as a gas exhaust port. When there is no inner wall for partitioning the space between the gas introduction port and the gas exhaust port, the mixing of oxygen and nitrogen introduced from the gas passages 53 and 54 respectively becomes insufficient, and the ozone generation effect may become unstable. By providing the inner wall 96, the oxygen and nitrogen are well mixed prior to reaching the central portion of the gas introducer 98. By irradiating the sufficiently mixed oxygen and nitrogen with ultraviolet rays at the central portion of the gas introducer 98, ozone can be generated with stable efficiency. Also in the sixth embodiment, the diameter of the upper surface irradiation port 82 can be adjusted as in the fifth embodiment.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A bonding device comprising:

an irradiator that irradiates a surface of a first component with ultraviolet rays;

a cover comprising a cavity; and a conveyor that conveys the first component into the cover, wherein a gas containing oxygen is introduced into the cavity and the irradiator irradiates the first component held by the conveyor with the ultraviolet rays to generate ozone from the oxygen in the gas, the ozone hydrophilizing the surface of the first component, and the conveyor conveys the first component irradiated with the ultraviolet rays to a surface of a second component, and brings the surface of the first component and the surface of the second component into contact with each other to bond the first component and the second component, wherein a gas containing oxygen is introduced into the cavity, wherein a first wall of the cover facing the irradiator transmits the ultraviolet rays, wherein the cover has a first opening in a second wall facing the first wall, wherein the conveyor conveys the first component to the first opening, wherein the cover has a first inner wall, a second inner wall, an intake port, and an exhaust port, wherein the first inner wall and the second inner wall are provided in the cavity, wherein the first inner wall divides the cavity into a first cavity and a second cavity, and has a second opening at a position facing the first opening, wherein the first cavity is located between the first wall and the first inner wall, wherein the second cavity is located opposite to the first cavity with the first inner wall interposed therebetween, wherein the second inner wall is provided between the first wall and the first inner wall, extends along an outer wall of the cover, and divides the first cavity into a third cavity and a fourth cavity, wherein the third cavity is located between the outer wall and the second inner wall, wherein the fourth cavity is located inside the second inner wall and communicates with the third cavity, wherein the intake port is connected to a portion of the outer wall facing the third cavity, and wherein the exhaust port is connected to a portion of the outer wall facing the second cavity.

2. The bonding device according to claim 1, wherein the irradiator irradiates a surface of one of a plurality of first components with the ultraviolet rays, the conveyor bonds the one of the first components and the second component, after bonding the one of the first components and the second component, the irradiator irradiates a surface of another first component of the plurality of first components with the ultraviolet rays, and the conveyor bonds the another first component and the second component.

3. The bonding device according to claim 1, further comprising:

a first placing member that places the first component;

a second placing member that places the second component; and a housing that houses the irradiator, the conveyor, the first placing member, and the second placing member therein.

4. The bonding device according to claim 1, wherein the irradiator irradiates the surface of the first component and a surface of the second component with the ultraviolet rays.

5. The bonding device according to claim 4, wherein the irradiator includes a first irradiator and a second irradiator, the first irradiator irradiates the surface of the first component with the ultraviolet rays, and the second irradiator irradiates the surface of the second component with the ultraviolet rays.

6. The bonding device according to claim 4, further comprising:

a brancher that branches the ultraviolet rays emitted from the irradiator;

wherein the surface of the first component and the surface of the second component are irradiated with the ultraviolet rays branched by the brancher.

7. The bonding device according to claim 1, further comprising:

a cover having a cavity therein;

wherein a gas containing oxygen is introduced into the cavity in the cover, and the irradiator irradiates the surface of the first component arranged in the cavity in the cover with the ultraviolet rays.

8. The bonding device according to claim 7, wherein a gas containing oxygen and nitrogen is introduced into the cavity in the cover, and the bonding device includes an adjuster that adjusts concentrations of the oxygen and the nitrogen.

9. The bonding device according to claim 1, wherein a length of the first opening is greater than a length of the first component and less than three times the length of the first component.

10. The bonding device according to claim 1, wherein the first component is a semiconductor chip formed of a compound semiconductor, and the second component is a substrate containing silicon.

11. The bonding device according to claim 1, wherein the conveyor includes a collet that attracts and holds the first component, and the irradiator irradiates the surface of the first component attracted to and held by the collet with the ultraviolet rays.

12. The bonding device according to claim 1, further comprising a chip stage on which the first component is placed, wherein the conveyor picks up the first component from the chip stage and conveys the first component to the irradiator.

13. The bonding device according to claim 1, further comprising a reflector disposed at a position facing the irradiator, wherein the reflector reflects the ultraviolet rays emitted from the irradiator toward the surface of the first component.

14. A bonding method for bonding a first component and a second component, the bonding method comprising:

conveying, by a conveyor of a bonding device, the first component into a cover comprising a cavity;

introducing a gas containing oxygen the cavity;

irradiating, by an irradiator of a bonding device, a surface of the first component with ultraviolet rays, wherein the irradiator irradiates the first component held by the conveyor with the ultraviolet rays to generate ozone from the oxygen in the gas, the ozone hydrophilizing the surface of the first component; and conveying, the conveyor, the first component irradiated with the ultraviolet rays to a surface of a second component to bring the surface of the first component and the surface of the second component into contact with each other to bond the first component and the second component, wherein a gas containing oxygen is introduced into the cavity, wherein a first wall of the cover facing the irradiator transmits the ultraviolet rays, wherein the cover has a first opening in a second wall facing the first wall, wherein the conveyor conveys the first component to the first opening, wherein the cover has a first inner wall, a second inner wall, an intake port, and an exhaust port, wherein the first inner wall and the second inner wall are provided in the cavity, wherein the first inner wall divides the cavity into a first cavity and a second cavity, and has a second opening at a position facing the first opening, wherein the first cavity is located between the first wall and the first inner wall, wherein the second cavity is located opposite to the first cavity with the first inner wall interposed therebetween, wherein the second inner wall is provided between the first wall and the first inner wall, extends along an outer wall of the cover, and divides the first cavity into a third cavity and a fourth cavity, wherein the third cavity is located between the outer wall and the second inner wall, wherein the fourth cavity is located inside the second inner wall and communicates with the third cavity, wherein the intake port is connected to a portion of the outer wall facing the third cavity, and wherein the exhaust port is connected to a portion of the outer wall facing the second cavity.

* * * * *